United States Patent
Puscar et al.

(10) Patent No.: US 12,255,661 B1
(45) Date of Patent: Mar. 18, 2025

(54) EARLY LOCK DETECTION FOR PHASE LOCKED LOOPS

(71) Applicant: QUALCOMM Incorporated, San Diego, CA (US)

(72) Inventors: Julian Puscar, Holly Springs, NC (US); Burcin Serter Ergun, Poway, CA (US); Brett Patrick Delaney, San Diego, CA (US); Zhiqin Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/537,304

(22) Filed: Dec. 12, 2023

(51) Int. Cl.
*H03L 7/095* (2006.01)
*H03L 7/18* (2006.01)

(52) U.S. Cl.
CPC ............ *H03L 7/095* (2013.01); *H03L 7/18* (2013.01)

(58) Field of Classification Search
CPC .................................. H03L 7/095; H03L 7/18
See application file for complete search history.

(56) References Cited

U.S. PATENT DOCUMENTS

| | | | | |
|---|---|---|---|---|
| 11,463,096 B2* | 10/2022 | Xu | ............................. | H03L 7/18 |
| 2010/0191438 A1* | 7/2010 | Guido | ................. | F02D 41/2435 |
| | | | | 701/102 |
| 2010/0199014 A1* | 8/2010 | Guido | ..................... | F02D 41/26 |
| | | | | 710/305 |
| 2015/0073739 A1* | 3/2015 | Khan | ...................... | H03L 7/193 |
| | | | | 702/78 |
| 2017/0346471 A1* | 11/2017 | Takahashi | .............. | G11C 7/222 |
| 2024/0250688 A1* | 7/2024 | Lu | .......................... | H03L 7/0807 |
| 2024/0322830 A1* | 9/2024 | Santiccioli | ................ | H03L 7/06 |

FOREIGN PATENT DOCUMENTS

CN   118337207 A  *  7/2024

* cited by examiner

Primary Examiner — Adam D Houston
(74) Attorney, Agent, or Firm — Loza & Loza, LLP

(57) ABSTRACT

A method for calibrating a phase locked loop (PLL) includes counting cycles of an output clock signal generated by the PLL until early phase lock signal is asserted when the cycles of the output clock signal counted within a first duration of time differ from a first target value by no more than a first maximum difference, counting cycles of the output clock signal until final phase lock signal is asserted when the cycles of the output clock signal counted within a second duration of time differ from a second target value by no more than a second maximum difference, the second duration of time being greater than the first duration of time, and using the output clock signal to control an operation in a physical layer circuit of a communication interface after the early phase lock signal is asserted and before the final phase lock signal is asserted.

20 Claims, 10 Drawing Sheets

EARLY LOCK DETECTION FOR PHASE LOCKED LOOPS

The present disclosure generally relates to clock generation circuits and, more particularly, to efficient, fast acquisition of frequency or phase lock in phase locked loops.

BACKGROUND

Electronic device technologies have seen explosive growth over the past several years. For example, growth of cellular and wireless communication technologies has been fueled by better communications, hardware, larger networks and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In some instance, the serial communication link is deployed between dice on a chip carrier. Increased capabilities and complexity of hardware and software functions implemented in IC devices has resulted in continuously increasing demand for higher data throughput with lower power consumption. Higher data throughput often requires increased accuracy of clock timing and the need for reducing power consumption can necessitate reducing the time spent performing certain procedures. There is an ongoing need for improved clock generation techniques and associated circuits that are used in high-speed serial links.

SUMMARY

Certain aspects of the disclosure relate to circuits, systems, apparatus, methods and techniques that support high speed serial communications within and between IC devices. A clock and data recovery circuit is disclosed. The disclosed clock generation circuit is implemented with a dual-loop sequential clock recovery circuit that provides proportional gain independently of an included voltage-controlled oscillator and that includes a bang-bang phase detection circuit.

In various aspects of the disclosure, a method for calibrating a phase locked loop (PLL) includes repetitively counting cycles of an output clock signal generated by the PLL until an early phase lock signal is asserted when the cycles of the output clock signal counted within a first duration of time differ from a first target value by no more than a first maximum difference, repetitively counting cycles of the output clock signal until a final phase lock signal is asserted when the cycles of the output clock signal counted within a second duration of time differ from a second target value by no more than a second maximum difference, the second duration of time being greater than the first duration of time, and using the output clock signal to control an operation in a physical layer circuit of a communication interface after the early phase lock signal is asserted and before the final phase lock signal is asserted. In some examples, the second duration of time includes the first duration of time.

In various aspects of the disclosure, a processor-readable storage medium that stores code that, when executed by a controller causes a calibration circuit to repetitively count cycles of an output clock signal generated by a PLL until an early phase lock signal is asserted when the cycles of the output clock signal counted within a first duration of time differ from a first target value by no more than a first maximum difference, repetitively count cycles of the output clock signal until a final phase lock signal is asserted when the cycles of the output clock signal counted within a second duration of time differ from a second target value by no more than a second maximum difference, the second duration of time being greater than the first duration of time, and use the output clock signal to control an operation in a physical layer circuit of a communication interface after the early phase lock signal is asserted and before the final phase lock signal is asserted.

In various aspects of the disclosure, a calibration circuit has a first counter configured to count cycles of an output clock signal generated by a PLL, a second counter configured to count cycles of a reference clock signal, a comparator configured to assert a match signal when a multibit output of the first counter differs from a target value input by no more than a maximum difference, and a controller. The controller may be configured to configure the target value input of the comparator with a first target value, configure the second counter to count a first number of cycles of the reference clock signal, and assert an early phase lock signal when the cycles of the output clock signal counted by the first counter differs from the first target value by no more than a first maximum difference after the second counter has counted the first number of cycles. The controller may be configured to configure the target value input of the comparator with a second target value, configure the second counter to count a second number of cycles of the reference clock signal, and assert a final phase lock signal when the cycles of the output clock signal counted by the first counter differs from the second target value by no more than a second maximum difference after the second counter has counted the second number of cycles. The output clock signal may be used to control an operation in a physical layer circuit of a communication interface after the early phase lock signal is asserted and before the final phase lock signal is asserted.

In certain aspects, a reference counter may be configured to count a first number of cycles of a reference clock signal before the early phase lock signal is asserted. The duration of the first number of cycles of the reference clock signal typically corresponds to the first duration of time. The reference counter may be further configured to count a second number of cycles of the reference clock signal after the early phase lock signal is asserted. The duration of the second number of cycles of the reference clock signal typically corresponds to the first duration of time. In some instances, the reference counter may be configured to continue counting from a value corresponding to the first number after the early phase lock signal is asserted. The second number may be greater than the first number.

In certain aspects, a PLL counter may be configured to count cycles of the output clock signal generated by the PLL. A comparator may be configured to compare an output of the PLL counter to the first target value before the early phase lock signal is asserted. The comparator may be configured to compare an output of the PLL counter to the second target value after the early phase lock signal is asserted. The PLL counter may be configured to continue counting from a value corresponding to its output captured when the early phase lock signal is asserted.

In certain aspects, the PLL may adjust frequency of the output clock signal when the cycles of the output clock signal counted within the first duration of time differs from the first target value by more than the first maximum difference before the early phase lock signal is asserted. The PLL may adjust frequency of the output clock signal when the cycles of the output clock signal counted within the second duration of time differ from the first target value by more than the second maximum difference after the early phase lock signal is asserted. The PLL may adjust the frequency of the output clock signal when a control input provided to a charge pump within the PLL is reconfigured. The first maximum difference may have the same value as the second maximum difference.

In certain aspects, a first bandwidth may be configured for the PLL before the early phase lock signal is asserted. A second bandwidth may be configured for the PLL after the final phase lock signal is asserted. The first bandwidth is typically greater than the second bandwidth. Bandwidth of the PLL may be configured by modifying a resistance value or a capacitance value in a low pass filter within the PLL.

DETAILED DESCRIPTION

Figure 1:
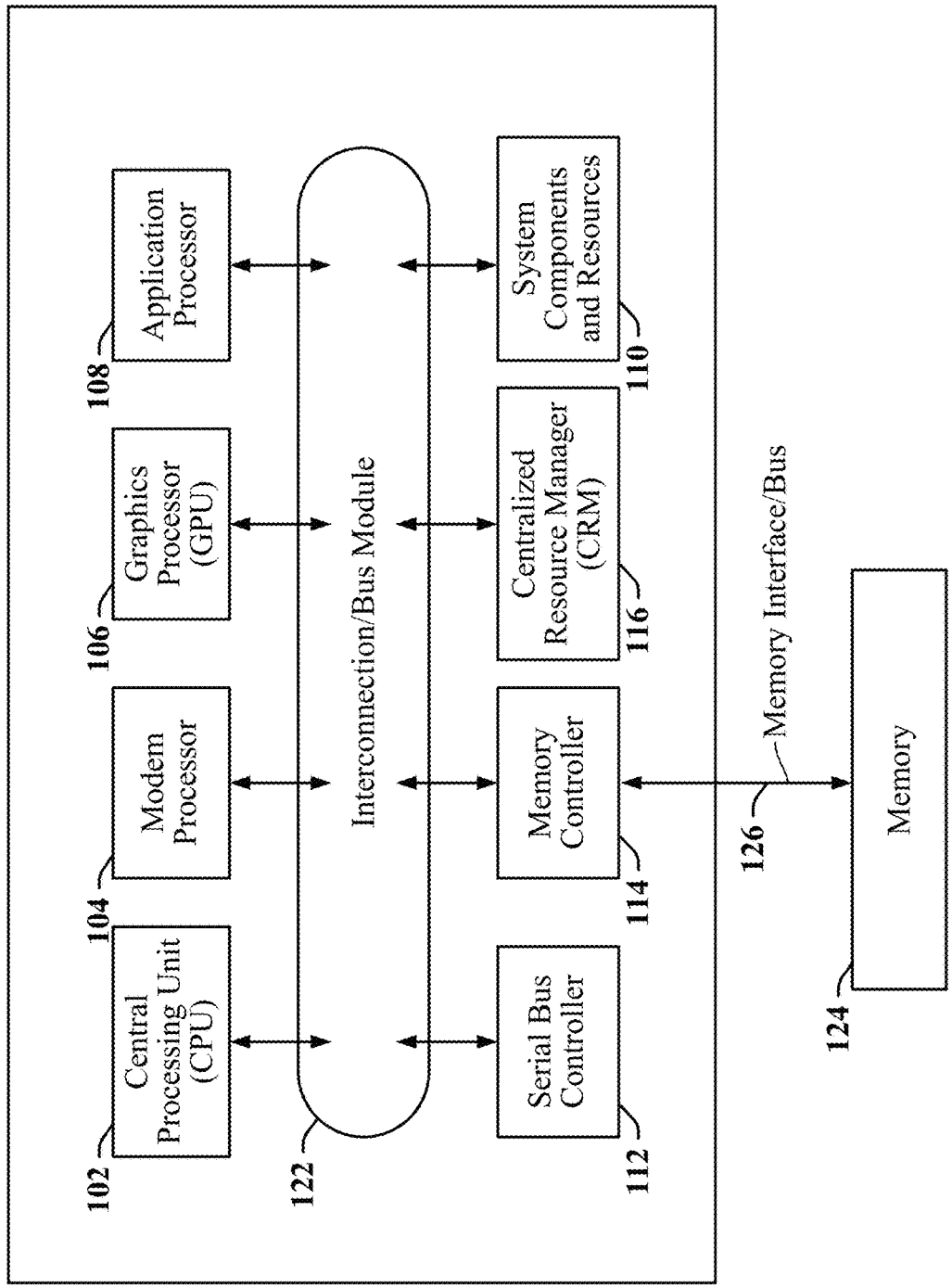
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the drawings, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may include storage media that is suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the serial bus controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may be implemented using one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
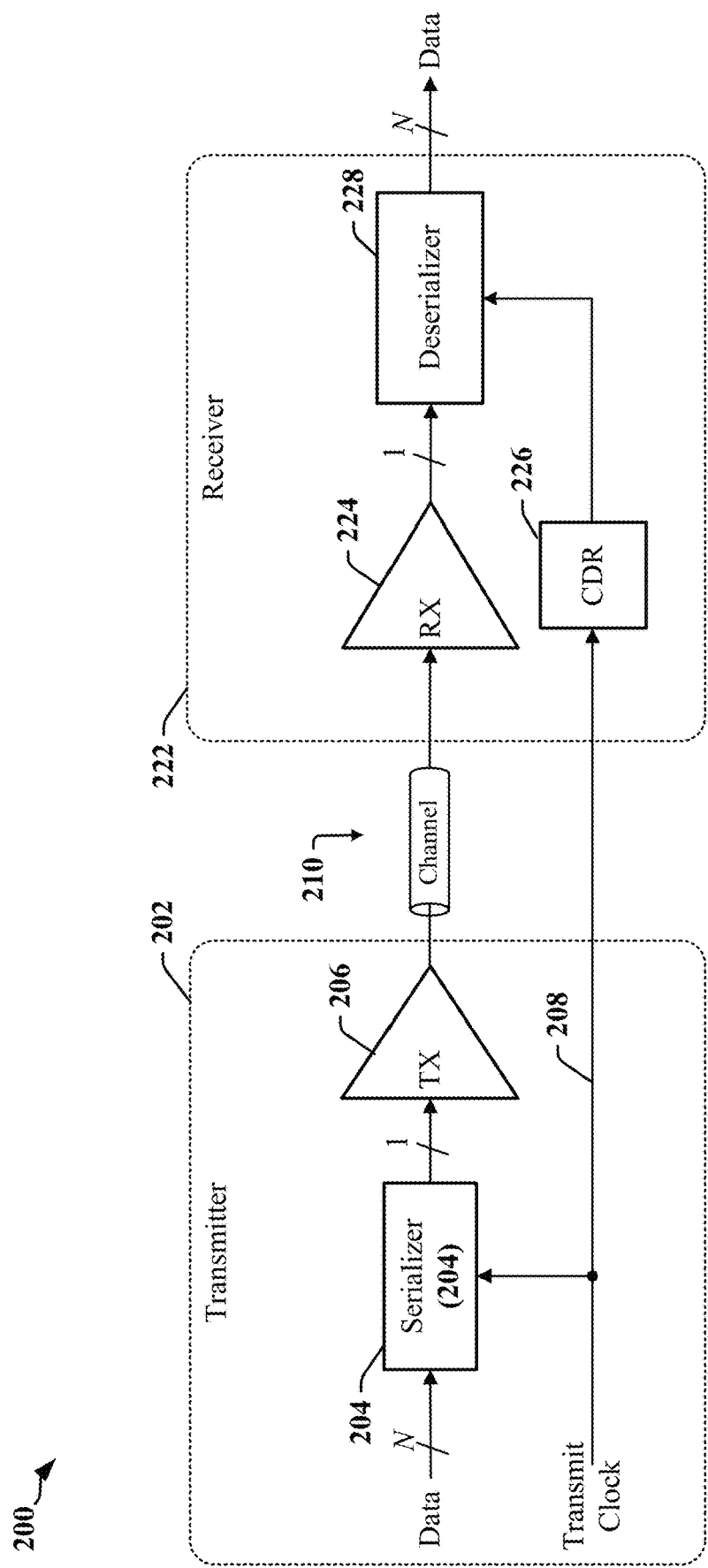
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert N-bit parallel data into a serial data stream. The transmitter 202 further includes a transmit driver 206 configured to generate a data signal representative of the serial data stream for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc. Certain aspects of this disclosure are applicable to serial communications between two dice provided on a chip-carrier. In some instances, the two dice may be coupled using a trace that has a length measurable as one or more millimeters. In some instances, the two dice may be coupled using a trace that has a length measurable as a fraction of a millimeter. In the latter example, the data communication channel 210 includes the millimeter-scale trace, input/output pads, interconnects, vias and traces within semiconductor devices.

The receiver 222 includes a receiving circuit (receiver 224), a clock data recovery circuit (the CDR 226) and a deserializer 228. In some implementations, the receiver 222 includes circuits configurable to perform equalization and amplification of the received data signal. Equalization circuits can boost the higher frequency components of a signal received from the data communication channel 210 in order to bring all frequency components of the signal to a similar amplitude and improve jitter. The CDR 226 is configured to receive a transmit clock signal 208 and to generate receive clock signals that can be used to sample or otherwise recover the serial data from the data signal based on information in the transmit clock signal 208. The CDR 226 may be configured to generate multiple signals from the transmit clock signal 208 received from the transmitter 202. The deserializer 228 is configured to convert the serial data back into parallel data.

The data signal or transmit clock signal 208 may be distorted when it arrives at the receiver 222. Distortion may arise for various reasons including impedance mismatches in the data communication channel 210, interference and reflected energy. Signal distortion can make it difficult to recover the clock and the data by the CDR 226 and can limit the window of stability during which data can be sampled. In some examples, distortion caused by high frequency attenuation can be addressed by equalization and amplification that increases the high frequency components of the data signal in order to increase the data rate at which the data signal may be sent through the data communication channel 210 and reliably recovered at the receiver 222. Distortion can produce timing errors and can introduce timing uncertainty or jitter that can compromise data the operation of the deserializer 228.

Improvements in semiconductor device technology and ever-increasing demand for performance in mobile communication devices and other battery-powered devices often necessitates increased data communication rates between IC devices. Increased data communication rates that are obtained through increased data transmission rates can significantly increase power consumption and decrease the maximum or rated operating time between battery charging events. Certain aspects of this disclosure can deliver high data rate communication at lower power levels, including in data communication links that can be used for a die-to-die communication links within the same package.

Figure 3:
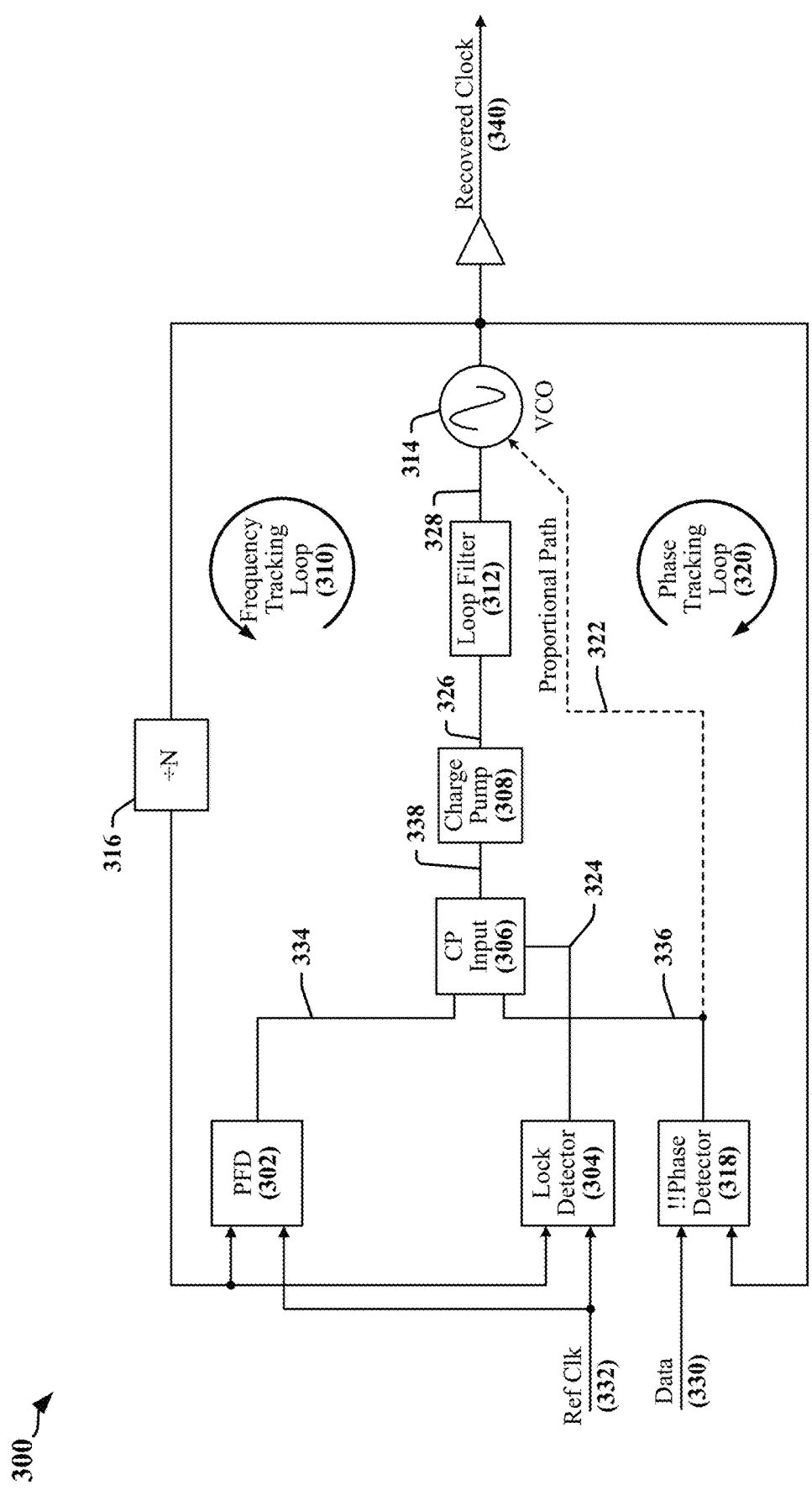
FIG. 3 illustrates a dual-loop clock generation circuit that includes a phase-locked loop (PLL).

FIG. 3 illustrates an example of a dual-loop clock generation circuit 300 that is based on a phase-locked loop (PLL). The clock generation circuit 300 is one of various types and/or configuration of clock generation circuits that can be controlled, monitored or managed according to certain aspects of this disclosure. The dual-loop clock generation circuit 300 has specific application in a receiving circuit in which the generated clock signal is expected to have a specific phase relationship with a data signal. However, the clock generation circuit 300 illustrates certain concepts applicable to the generation of a clock signal for transmission over a clock lane of a data communication bus. For example, the clock generation circuit 300 includes easily identifiable frequency and phase tracking feedback loops. The illustrated clock generation circuit 300 may be provided in a receiver such as the receiver 222 of the data communication system 200 illustrated in FIG. 2 in order to synchronize a received data signal 330 with a clock signal. In one example, the received data signal 330 may be encoded as an analog non-return-to-zero (NRZ) signal, which is input to a phase detector 302.

The phase detector 318 may be a bang-bang phase detector, which is indicated in the drawings as a "!!Phase Detector". A bang-bang phase detector compares the phase of two input signals and provides an output which distinguishes positive and negative phase differences between the input signals. In some implementations, the phase detector 318 can be configured to provide an output that indicates a matching, leading or lagging phase relationship between the input signals. In some implementations, the phase detector 318 can be configured to provide an output that includes control signals that can be used to tune a voltage-controlled oscillator (e.g., the VCO 314), phase interpolator or other circuit that can output a signal with a configurable frequency or phase relationship with a reference signal.

The output of a VCO 314 provides feedback to a frequency-tracking loop 310 and a phase tracking loop 320. In the illustrated dual-loop clock generation circuit 300, the received data signal 330 is input to the phase detector 318, which operates within the phase tracking loop 320. When the phase tracking loop 320 is controlling the VCO 314, the phase detector 318 tracks the phase of the received data signal 330 with respect to the output of the VCO 314 and generates control signals 336 that are configured to control a charge pump 308. In one example, the control signals 336 include up and down signals that are configured to increase, decrease or maintain a voltage or current level provided at the output of the charge pump 308.

The frequency-tracking loop 310 responds to a reference clock signal 332. In some implementations, the reference clock signal 332 may be generated within the receiving device. The reference clock signal 332 is coupled to a first input of a phase and frequency detector circuit 302. The phase and frequency detector circuit 302 detects differences in phase and frequency between the reference clock signal 332 and the output of the VCO 314. When the frequency tracking loop 310 is controlling the VCO 314, the phase and frequency detector circuit 302 generates control signals 334 that are configured to control the charge pump 308. In one example, the control signals 334 include up and down signals that operate to increase, decrease or maintain a voltage or current level provided at the output of the charge pump 308.

The inputs to the charge pump 308 may be controlled, combined, selected or otherwise managed by input control logic (the CP Input module or circuit 306). In one example consistent with the illustrated clock generation circuit 300, the CP Input module or circuit 306 includes a multiplexer that is configured to select between the control signals 334 generated by the phase tracking loop 320 and the control signals 336 generated by the frequency tracking loop 310. In another example consistent with the illustrated clock generation circuit 300, the CP Input module or circuit 306 includes a summer or adder that combines the control signals 334 generated by the phase tracking loop 320 and the control signals 336. In some instances, the summer or adder generates the output 338 of the CP Input module or circuit 306 as a weighted sum of its input currents. The output 338 of the CP Input module or circuit 306 is provided to the charge pump 308. The charge pump 308 responds to the output 338 of the CP Input module or circuit 306 by generating a response signal 326. The response signal 326 is provided to a loop filter 312, which may be implemented as a low pass filter. The filtered response 328 output by the loop filter 312 is used to control the VCO 314. The output of VCO 314 may be used to generate the recovered clock signal 340.

The output of the VCO 314 is fed back into a second input of the phase and frequency detector circuit 302 through a divider circuit 316 to complete the frequency tracking loop 310. The frequency tracking loop 310 may be configured to adjust the frequency of the recovered clock signal 340 until frequency lock is accomplished when the frequencies of the reference clock signal 332 and the recovered clock signal 340 match or differ by a margin that lies within predefined limits. The output of the VCO 314 is also fed back into the phase detector 318 to complete the phase tracking feedback loop 320. In some implementations, the phase tracking loop 320 may be configured to align the phase of the recovered clock signal 340 with the phase of the received data signal 330 after frequency lock is accomplished.

In some implementations, the CP Input module or circuit 306 selects between the control signals 334 generated by the phase and frequency detector circuit 302 in the frequency tracking loop 310 and the control signals 336 generated by the phase detector 318 in the phase-tracking loop 320 to drive its output 338 and thereby provide control signals to the charge pump 308. In these implementations, the selection between the control signals 334, 336 may be based on the signaling state of a lock detect signal 324. The lock detect signal 324 is generated by a lock detector circuit 304 and is in a first signaling state when the frequency tracking loop achieves lock and is in a second signaling state when the frequency tracking loop loses lock. The control signals 334 generated by the phase and frequency detector circuit 302 in the frequency tracking loop 310 are selected when the lock detect signal 324 is in the second signaling state, to permit the dual-loop clock generation circuit 300 to achieve frequency lock. After frequency lock is achieved, the lock detector circuit 304 transitions to the first signaling state and the dual-loop clock generation circuit 300 actively tracks phase using the phase-tracking loop 320.

The dual-loop clock generation circuit 300 illustrated in FIG. 3 may be operated as a sequential dual-loop clock generation circuit when the CP Input module or circuit 306 includes a multiplexer that is configured to enable only one of the frequency tracking loop 310 and the phase-tracking loop 320 to control the VCO 314 at any time such that frequency and phase locks are achieved sequentially. In other implementations, the phase-tracking loop 320 and the frequency tracking loop 310 exercise some level of joint control over the VCO 314 and frequency and phase locks can be achieved concurrently.

In some clock generation circuits, the output of a charge pump is included in an "integral path" that is used to control a VCO and an output of a phase detector directly controls the VCO using a "proportional path." For illustrative purposes only, the dashed line 322 in FIG. 3 is provided to indicate a proportional path that would bypass the charge pump 308 in the phase-tracking loop 320. The proportional path is primarily responsible for locking the PLL, while the integral path can track slow time variations, including variations caused by temperature and voltage variances.

Lock time constraints tend to become stricter as specifications are changed to govern generations of SERDES interfaces. In one example, stricter lock time constraints may further limit the permitted period defined for wakeup following a cold start of a communication interface. A cold start may refer to initialization after powerup of the communication interface or after a system reset that clears all prior state information and/or reconfigures the communication interface to a predefined state. In one example, stricter lock time constraints may limit the period of time during which a PLL must switch from one frequency gear to another. Here switching gears refers to changes between output clock frequencies that require the PLL and/or other clock generation circuit to achieve lock at a new frequency of operation (re-lock). In some instances, the stricter lock time constraints are defined to enable a system to meet critical power saving strategies. In one example, re-lock time may be reduced from approximately 15 µs, to 5 µs or less.

Certain aspects of this disclosure provide mechanisms that can accelerate acquisition of frequency and/or phase lock of a PLL without degrading frequency stability and phase locking accuracy. In one aspect loop dynamics may be configured using certain control signals (CPc) to adjust current flow in a charge pump, and other controls that configure loop filters, including controls (Rc) that configure resistance and controls (Cc) that configure capacitance. The CPc, Rc and Cc controls may be manipulated using software or firmware configurable parameters, feedback or other mechanisms. Certain parameters that define the Rc, Cc, and CPc control settings may be configured during power-on, initialization and/or before the PLL is activated. The PLL may then be calibrated such that it outputs a clock signal with a specified or desired frequency. An output signal may be generated to notify PHY level circuits that the PLL is locked when the clock signal has the specified or desired frequency. PLL lock indicates that the PLL is ready for operation and its output clock can be used as specified.

Certain aspects of this disclosure relate to acquisition of frequency lock and/or phase lock of a PLL after system cold start or after the SERDES interface switches gears in a manner that necessitates reconfiguration of the PLL. Frequency lock and phase lock are typically acquired in a calibration procedure. In some implementations, the calibration procedure uses a reference clock source that produces a reference clock signal with a highly stable frequency. In one example, the specifications for the reference clock signal may be expressed in terms of a SERDES interface. The specifications for the reference clock signal typically define tolerances that may be expressed as parts per million (ppm) variances from a nominal value. In one example, the permissible variance from nominal frequency specified for a signal may be better expressed using a relative measure (ppm) rather than as an absolute maximum frequency variation from nominal frequency. In another example, certain PCIe devices must transmit data over a communication link at a rate that delivers data bits within a time period that is within 600 ppm (i.e., ±300 ppm) of the nominal transmission clock period specified for the communication link.

Figure 4:
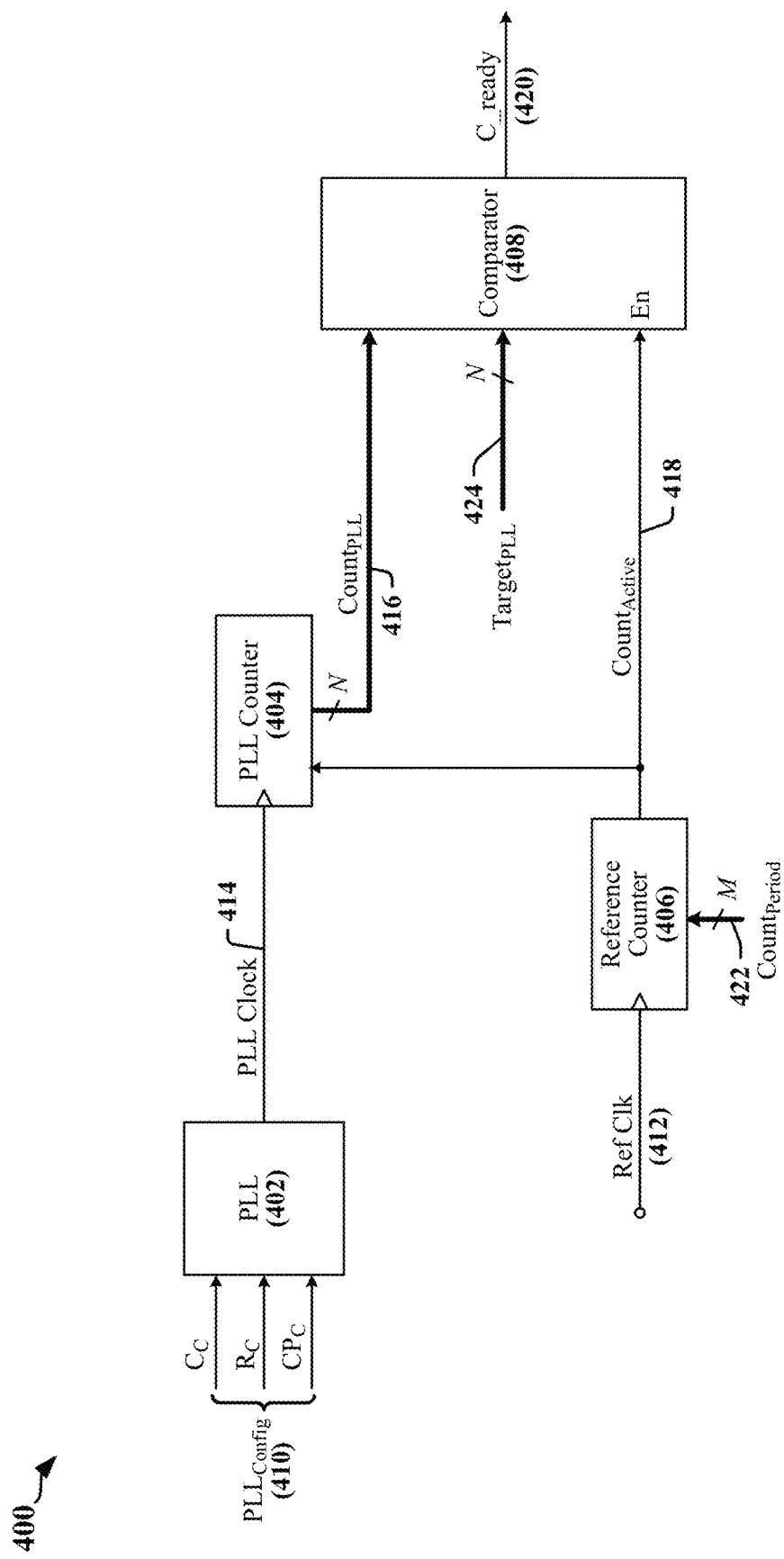
FIG. 4 illustrates a calibration circuit that may be adapted in accordance with certain aspects of this disclosure.

FIG. 4 illustrates a calibration circuit 400 that may be adapted in accordance with certain aspects of this disclosure. The calibration circuit 400 may be used to configure and calibrate a PLL 402. The PLL 402 may be configured using control signals 410 that include resistance control signals (Rc), capacitance control signals (Cc) and charge pump control signals (CPc). The PLL 402 may be configured to generate a clock signal 414 and may be calibrated when the PLL output clock signal 414 has a frequency that matches a predefined nominal frequency or varies from the nominal frequency within the tolerances defined for a communication link associated with the PLL 402. The calibration circuit 400 may provide an output signal (the C_ready signal 420) that indicates when the PLL 402 is locked and when the PLL output clock signal 414 is ready for operation.

The PLL output clock signal 414 is coupled to a counter (the PLL counter 404) that is configured to count cycles of the PLL output clock signal 414. The PLL counter 404 may be reset before a calibration cycle commences. The output of the PLL counter 404 includes an N-bit counter value 416 representing the number of cycles of the PLL output clock signal 414 counted by the PLL counter 404.

The calibration circuit 400 includes a reference counter 406 that is configured to count clock cycles of a reference clock signal 412. The frequency of the reference clock signal 412 is expected to be highly stable and sufficient to meet tolerances required for a SERDES interface, for example, that is associated with the PLL 402. The reference clock signal 412 typically has a frequency that is significantly lower than the frequency of the PLL output clock signal 414. In one example, the reference clock signal 412 has a frequency of 19.2 MHz and the PLL 402 is configured to produce a PLL output clock signal 414 at a frequency of 666.67 MHz. During each calibration cycle, the calibration circuit 400 may be configured to count a number of clock cycles of the reference clock signal 412 and to determine whether the number of cycles of the PLL output clock signal 414 counted by the PLL counter 404 matches the expected or target number of cycles for a PLL output clock signal 414 that has a nominal or desired frequency.

In the illustrated example, the reference counter 406 may be preloaded with a count value (the Count$_{Period}$ 422) defining the duration of counting expressed as the number of cycles of the reference clock signal 412 to be counted. The PLL counter 404 may be reset. The PLL counter 404 and the reference counter 406 are enabled and begin counting cycles of their respective clock signals 414, 412. The reference counter 406 may provide a signal (the Count$_{Active}$ signal 418) to indicate counting is in progress or has been terminated. In one example, the Count$_{Active}$ signal 418 indicates that counting by the reference counter 406 has commenced and has not yet terminated. In another example, the Count$_{Active}$ signal 418 indicates that the reference counter 406 has reached zero or has overflowed indicating end of count has been reached. In another example, the Count$_{Active}$ signal 418 indicates that the reference counter 406 has a non-zero value indicating end of count has not been reached. In some implementations, the Count$_{Active}$ signal 418 may be provided as a control signal to the PLL counter 404.

In the illustrated example, the Count$_{Active}$ signal 418 is provided to a comparator 408. The comparator 408 may capture at least a portion of an N-bit counter value 416 when the reference counter 406 has counted the number of cycles of the reference clock signal 412 to be counted, as defined by Count$_{Period}$ 422. The comparator 408 compares the captured portion of the N-bit counter value 416 to a preconfigured target value 424 that corresponds to a number that indicates that the PLL output clock signal 414 has a nominal or desired frequency. In some instances, a certain number of least significant bits of the N-bit counter value 416 may be masked or ignored to allow for permissible levels of variation (tolerances) of the frequency of the PLL output clock signal 414. For example, four bits of the N-bit counter value 416 may be masked or ignored to implement a tolerance corresponding to 16 cycles of the PLL output clock signal 414. The C_ready signal 420 may be asserted when the comparator 408 determines that the captured portion of the N-bit counter value 416 matches the preconfigured target value 424. In some implementations, the comparator 408 may indicate whether the captured portion of the N-bit counter value 416 is greater or less than the preconfigured target value 424 such that the PLL 402 can be reconfigured to produce a reduced or increased frequency.

Figure 5:
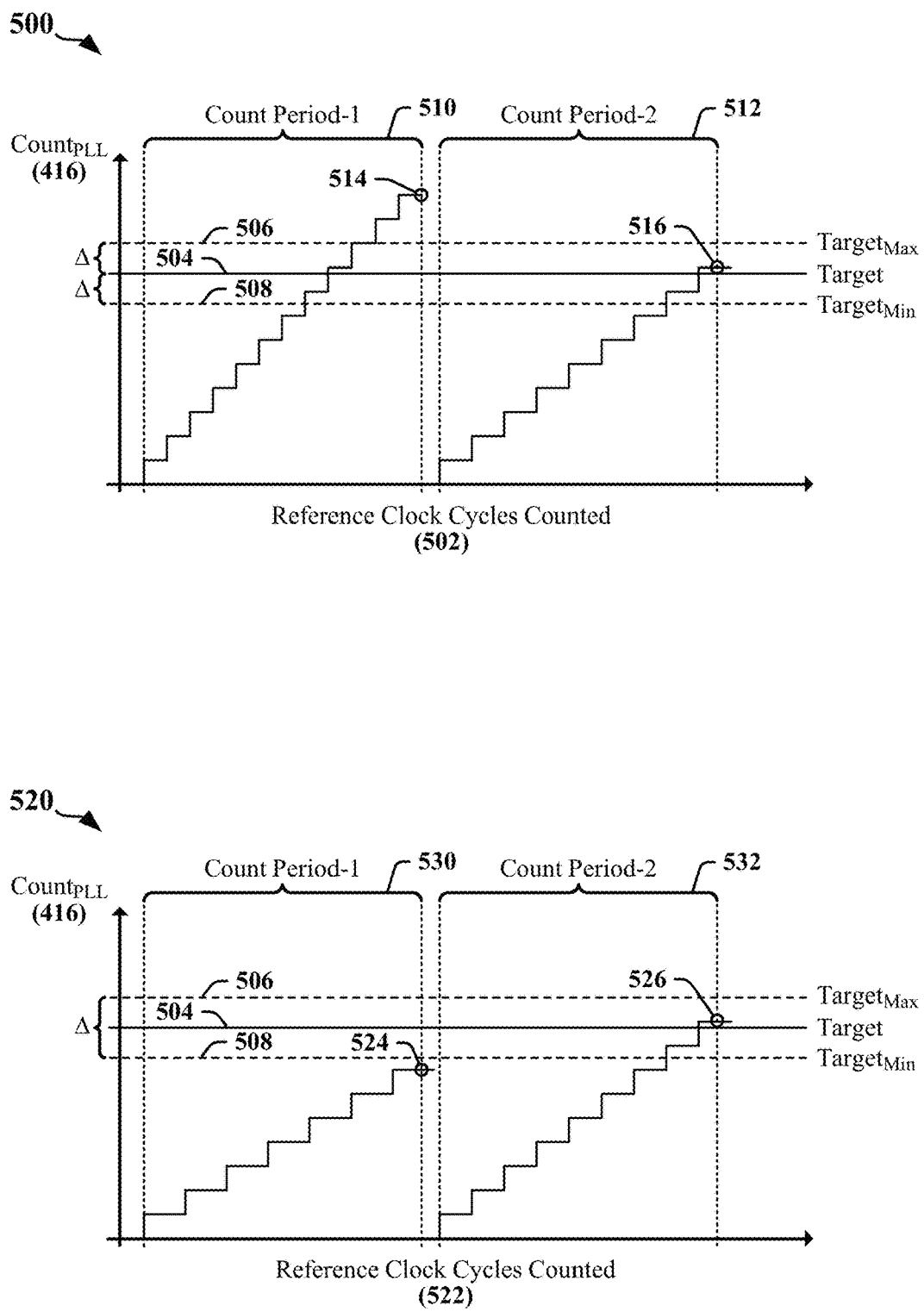
FIG. 5 includes timing diagrams illustrating examples of calibration procedures that may be implemented using the calibration circuit illustrated in FIG. 4.

FIG. 5 includes timing diagrams illustrating examples of calibration procedures 500, 520 that may be implemented using the calibration circuit 400 illustrated in FIG. 4. The first calibration procedure 500 represents an example in which the PLL output clock signal 414 has an initial frequency that is greater than the maximum desired frequency. The N-bit counter value 416 is represented on the y-axis and the number of cycles 502 of the reference clock signal 412 counted during the calibration procedure is represented on the x-axis.

In a first count period 510, the N-bit counter value 416 exceeds the upper limit 506 of the tolerance associated with the target count value 504 at a point in time 514 when the reference counter 406 has counted the number of cycles of the reference clock signal 412 to be counted. The PLL 402 may be reconfigured to reduce the frequency of the PLL output clock signal 414 and a second count period 512 is initiated. In the illustrated example, the N-bit counter value 416 lies between the upper limit 506 and the lower limit 508 associated with the target count value 504 at a point in time 516 when the reference counter 406 has counted the number of cycles of the reference clock signal 412 to be counted and the C_ready signal 420 may be asserted at the end of the second count period 512.

The second calibration procedure 520 represents an example in which the PLL output clock signal 414 has an initial frequency that is less than the minimum desired frequency. The N-bit counter value 416 is represented on the y-axis and the number of cycles 522 of the reference clock signal 412 counted during the calibration procedure is represented on the x-axis.

In a first count period 530, the N-bit counter value 416 is less than the lower limit 508 of the tolerance associated with the target count value 504 at a point in time 524 when the reference counter 406 has counted the number of cycles of the reference clock signal 412 to be counted. The PLL 402 may be reconfigured to reduce the frequency of the PLL output clock signal 414 and a second count period 532 is initiated. In the illustrated example, the N-bit counter value 416 lies between the upper limit 506 and the lower limit 508 associated with the target count value 504 at a point in time 526 when the reference counter 406 has counted the number of cycles of the reference clock signal 412 to be counted and the C_ready signal 420 may be asserted at the end of the second count period 512.

Figure 6:
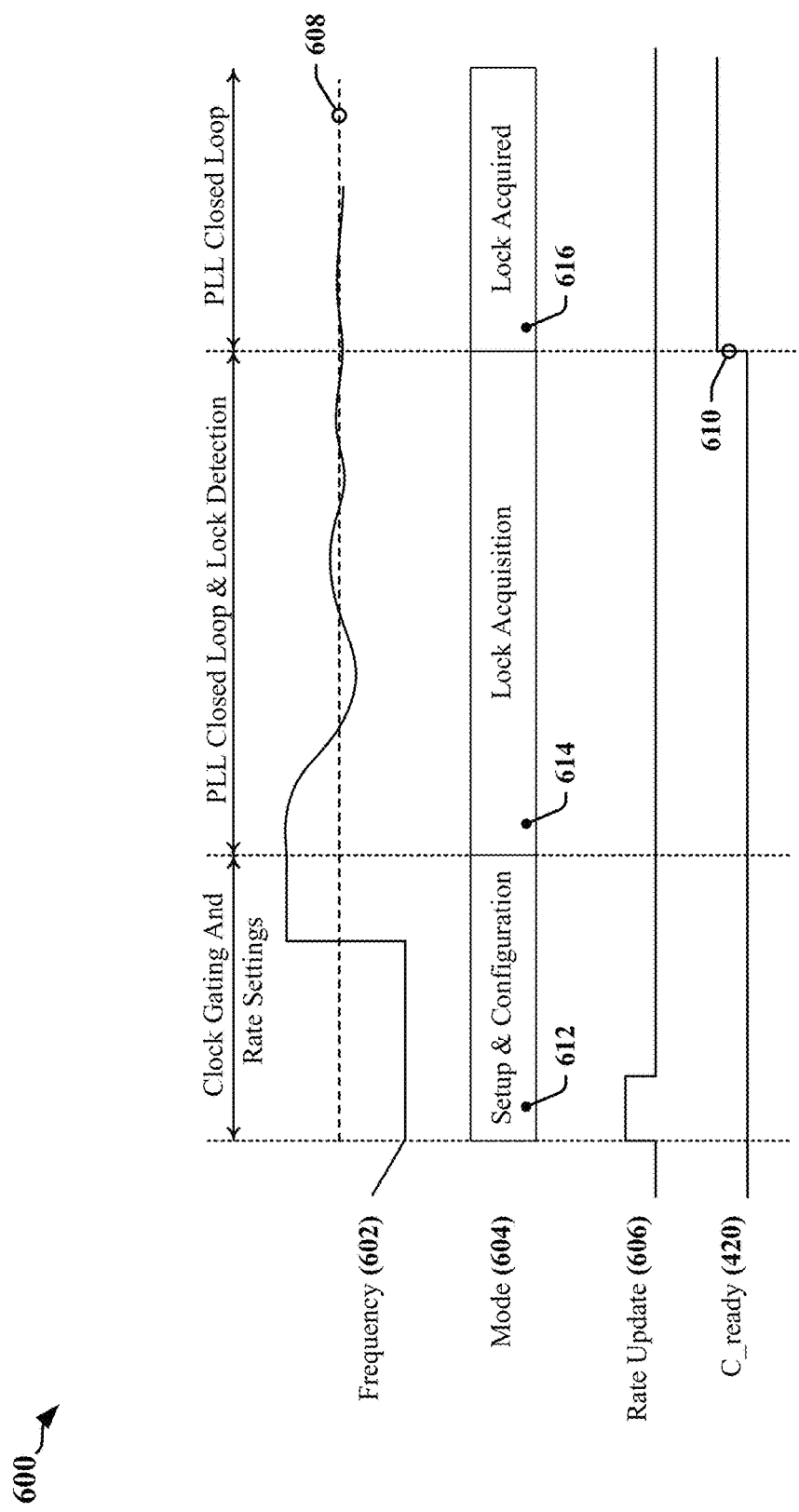
FIG. 6 illustrates a timeline associated with a calibration procedure illustrated in FIG. 5.

FIG. 6 illustrates the timeline 600 associated with the first calibration procedure 500 illustrated in FIG. 5. The timeline 600 identifies multiple modes 604 associated with the calibration procedure 500. During an initial setup and configuration mode 612, the PLL 402 is enabled and produces a PLL output clock signal 414 with a frequency 602 that is initially greater than the maximum desired frequency 608. The setup and configuration mode 612 may be initiated in response to a pulse on the Rate Update signal 606 which may be asserted after a cold start or after the SERDES interface switches gears in a manner that necessitates reconfiguration of the PLL 402. The calibration procedure 500 enters a lock acquisition mode 614 which includes one or more count periods 510, 512. The PLL 402 may be reconfigured after certain of the count periods 510, 512 until the C_ready signal 420 is asserted 610 indicating that the PLL output clock signal 414 has a frequency 602 that is an acceptable match with the maximum desired frequency 608. The lock acquisition mode 614 is terminated and a lock acquired mode 616 commences, enabling the PLL 402 to be operated normally.

The tolerance for the PLL output clock signal 414, which may be defined as the maximum or minimum acceptable variance from the nominal frequency, may be expressed as a parts per million (ppm) variance. The calibration scheme illustrated in FIGS. 4-6 can calibrate the frequency of the PLL output clock signal 414 by counting a sufficient number of cycles of the reference clock signal 412 in each count period 510, 512, 530, 532. In the illustrated example, the target count value 504 may be calculated as:

$$\text{Target} = \frac{t_{Ref} \times RefCycles}{t_{PLL}},$$

where: $t_{Ref}$ represents the period of the reference clock signal 412,
RefCycles represents the number of reference clock cycles counted, and
$t_{PLL}$ represents the period of the PLL output clock signal 414.

The variance from a nominal frequency (f), expressed in PPM, may be calculated as:

$$\text{Variance} = \frac{\Delta f}{f} \times 10^6,$$

where: Δf represents the difference between maximum and minimum acceptable frequencies.

In an example discussed herein, four bits of the N-bit counter value 416 may be masked or ignored by the comparator 408 to implement a specified tolerance. The four-bit count corresponds to 16 cycles of the PLL output clock signal 414. The variance expressed in ppm is inversely proportional to the target count value needed to measure the variance. Increased calibration accuracy can be accomplished by increasing the target count value and, consequently, the reference count value.

Advances in technology often require that PLLs generate clock signals with increased frequency. The time available for calibration and for achieving frequency lock have been continually reduced in revised specifications and power budget for SERDES interface circuits are typically also reduced to control heat and preserve battery power in applications related to mobile communication devices. Reducing the time available for calibration limits the target count value and can reduce calibration accuracy.

Calibration techniques disclosed herein can reduce PLL calibration time without negatively impacting the quality and/or accuracy of calibration. In one aspect, an initial low-resolution calibration can be quickly performed to obtain an early or preliminary PLL lock for a clock signal that has sufficient quality to support or enable various operations related to PHY wakeup and initialization. In some implementations, a signal is provided that indicates when early PLL lock has been acquired. The early PLL lock is acquired for a clock signal subject to less strict tolerances. For example, the output clock of a PLL may have a worse PPM variance than specified for the interface when early PLL lock is acquired. A lower quality output clock can be used to enable and initialize certain finite state machines, perform certain transmitter circuit calibrations, flush buffers and establish link readiness within the interface. After acquiring early PLL lock, PLL calibration can continue using target values suited to the required tolerances defined for a communication link, for example.

Figure 7:
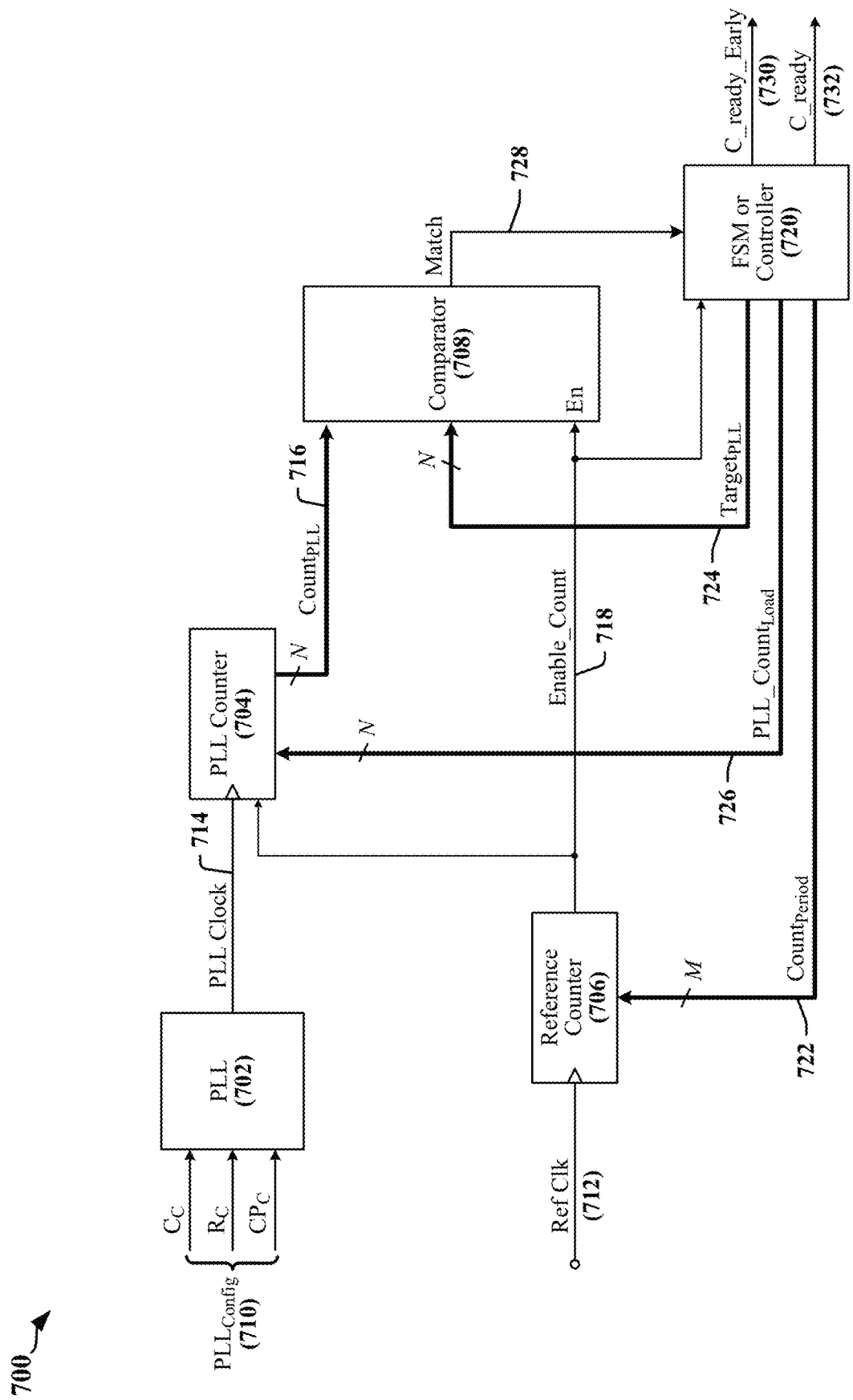
FIG. 7 illustrates a calibration circuit that may be configured in accordance with certain aspects of this disclosure.

FIG. 7 illustrates a calibration circuit 700 that may be configured in accordance with certain aspects of this disclosure. The calibration circuit 700 may be used to configure and calibrate a PLL 702. The PLL 702 may be configured using control signals 710 that include resistance control signals (Rc), capacitance control signals (Cc) and charge pump control signals (CPc). The PLL 702 may be configured to generate a clock signal 714 and may be calibrated when the PLL output clock signal 714 has a frequency that matches a predefined nominal frequency or varies from the nominal frequency within tolerances defined for a communication link associated with the PLL 702. The calibration circuit 700 may provide a first output signal (the C_ready signal 732) that indicates when the PLL 702 is locked and operating within tolerances defined for the communication link, and that its PLL output clock signal 714 is ready for full operation. The calibration circuit 700 may also provide a second output signal (the C_ready_Early signal 730) that indicates when the PLL 702 is locked and operating within relaxed tolerances that may not meet the tolerances defined for the communication link. Certain initialization, calibration and other functions may be performed within physical layer circuits when the C_ready_Early signal 730 is asserted.

The PLL output clock signal 714 is coupled to a counter (the PLL counter 704) that is configured to count cycles of the PLL output clock signal 714. The PLL counter 704 may be reset before calibration commences. In the illustrated example, the counter value of the PLL counter 704, which is provided in the $\text{Count}_{PLL}$ signal 716, may be preloaded with a value provided in an N-bit signal (the $\text{PLL\_Count}_{Load}$ signal 726) provided by a finite state machine (the FSM 720), a controller, or another processor or sequencing logic. The $\text{Count}_{PLL}$ signal 716 output by the PLL counter 704 includes an N-bit counter value, generally representing the total number of cycles of the PLL output clock signal 714 counted by the PLL counter 704.

The calibration circuit 700 includes a reference counter 706 that is configured to count clock cycles of a reference clock signal 712. The frequency of the reference clock signal 712 is expected to be highly stable and sufficient to meet tolerances required for a SERDES interface associated with the PLL 702. The reference clock signal 712 typically has a frequency that is significantly lower than the frequency of the PLL output clock signal 714. In one example, the reference clock signal 712 has a frequency of 19.2 MHz and the PLL 702 is configured to produce a PLL output clock signal 714 at a frequency of 666.67 MHz. During each calibration cycle, the reference counter 706 may be configured to count a number of clock cycles of the reference clock signal 712.

In the illustrated example, the reference counter 706 may be preloaded by the FSM 720 with a count value (the $\text{Count}_{Period}$ 722) that defines the duration of counting expressed as the number of cycles of the reference clock signal 712 to be counted. The $\text{Count}_{Period}$ 722 may be configured by the FSM 720 or another processor. The PLL counter 704 may be disabled until the reference counter 706 begins counting. In the illustrated example, the PLL counter 704 and the reference counter 706 may be enabled and begin counting cycles of their respective clock signals 714, 712 when an enable signal (the Enable_Count signal 718) is asserted. The Enable_Count signal 718 may be provided to a comparator 708. In some implementations, the reference counter 706 may provide the Enable_Count signal 718. In other implementations, the Enable_Count signal 718 may be provided by the FSM 720 in response to information received from the reference counter 706, the PLL counter 704 and/or the comparator 708.

The comparator 708 may be configured to capture at least a portion of the N-bit counter value provided in the $\text{Count}_{PLL}$ signal 716 when the reference counter 706 has counted the number of cycles of the reference clock signal 712 to be counted, as defined by the $\text{Count}_{Period}$ 722. In some instances, the comparator 708 is configured to capture or record a comparison result when the Enable_Count signal 718 indicates that the reference counter 706 has terminated counting. The comparator 708 compares the N-bit counter value provided in the $\text{Count}_{PL}$a signal 716 or a portion of the N-bit counter value provided in the $\text{Count}_{PLL}$ signal 716 to a preconfigured target value 724 or to a portion of the preconfigured target value 724. The preconfigured target value 724 corresponds to a number that indicates that the PLL output clock signal 714 has a nominal or desired frequency. The target value 724 may be configured by the FSM 720 or another processor.

In some instances, a certain number of least significant bits of the N-bit counter value provided in the $\text{Count}_{PLL}$ signal 716 may be masked or ignored to allow for permissible levels of variation (tolerances) of the frequency of the PLL output clock signal 714. For example, four bits of the N-bit counter value provided in the Count$_{PLL}$ signal 716 may be masked or ignored to implement a tolerance corresponding to 16 cycles of the PLL output clock signal 714.

In the illustrated example, the FSM 720 may be configured to manage and control a two-phase calibration procedure. In other implementations, the two-phase calibration procedure may be managed by a one or more processors, one or more controllers, sequencing logic or some combination thereof. The first phase of the calibration procedure includes an initial low-resolution calibration that can be quickly performed to obtain an early PLL lock for the PLL output clock signal 714. After the first phase of the calibration procedure the PLL output clock signal 714 may have sufficient quality to support or enable various operations related to PHY wakeup and initialization. In some implementations, a signal (the C_ready_Early signal 730) is asserted to indicate that early PLL lock has been acquired using relaxed tolerances.

The second phase of the calibration procedure includes a high-resolution calibration that is performed to obtain a PLL lock for a clock signal that is expected to fall within stricter tolerances specified for the PLL output clock signal 714. In some implementations, the second phase of the calibration procedure resumes counting of cycles of the PLL output clock signal 714 without resetting the PLL counter 704. At the completion of the first phase of the calibration procedure, the number of cycles of the PLL output clock signal 714 that has been counted may be a relatively small proportion of the target number of cycles of the PLL output clock signal 714 defined for the second phase of the calibration procedure. The larger number of clock cycles enables the calibration circuit 700 to enforce a lower ppm variance and thereby acquire a final PLL lock for the PLL output clock signal 714. The final PLL lock may be acquired when the frequency of the PLL output clock signal 714 falls within the strict tolerances specified for the PLL output clock signal 714. The final PLL lock may indicate that the PLL output clock signal 714 is a high quality signal that meets specified tolerances. The C_ready signal 732 may be asserted when the final PLL lock has been acquired.

The FSM 720 may be configured to respond to the Enable_Count signal 718 and a signal (the Match signal 728) provided by the comparator 708. When the reference counter 706 has completed counting, the FSM 720 may determine whether a further calibration cycle is needed. When operating in the first phase of the calibration procedure, the FSM 720 may configure the reference counter 706 for a short, quick count and may configure the target value 724 for low-resolution calibration. In some implementations, the comparator 708 can indicate whether the frequency of the PLL output clock signal 714 is too high or too low when the Match signal 728 is not asserted when the reference counter 706 completes its counting. The PLL 702 may be caused to adjust frequency of the PLL output clock signal 714 accordingly.

The FSM 720 may assert the C_ready_Early signal 730 when the Match signal 728 is asserted when the reference counter 706 completes a counting cycle in the first phase of the calibration procedure. The FSM 720 may then configure the calibration circuit 700 for the second phase of the calibration procedure. When operating in the second phase of the calibration procedure, the FSM 720 may configure the reference counter 706 for a count value consistent with the stricter tolerances specified for a nominal PLL output clock signal 714. The FSM 720 may further configure the target value 724 consistent with the stricter tolerances used in the second phase of the calibration procedure.

In the second phase of the calibration procedure, the FSM 720 may determine whether an additional second phase calibration cycle is needed after the reference counter 706 completes its count based on signaling state of the Match signal 728. In one example, an additional second phase calibration cycle may be initiated when the Match signal 728 is not asserted after the reference counter 706 has completed its count. The FSM 720 may assert the C_ready signal 732 and terminate calibration if the Match signal 728 is asserted when the reference counter 706 has completed its counting in the second phase of the calibration procedure.

In some implementations, the FSM 720 may cause the configuration of the PLL 702 to be modified if the Match signal 728 is not asserted when the reference counter 706 has completed its count. In some implementations, the PLL 702 may be reconfigured based on information provided by the comparator that indicates whether the N-bit counter value provided in the Count$_{PLL}$ signal 716 is greater or less than the preconfigured target value 724. In some implementations, the FSM 720 may configure the control signals 710 used to control the PLL 702 directly.

Figure 8:
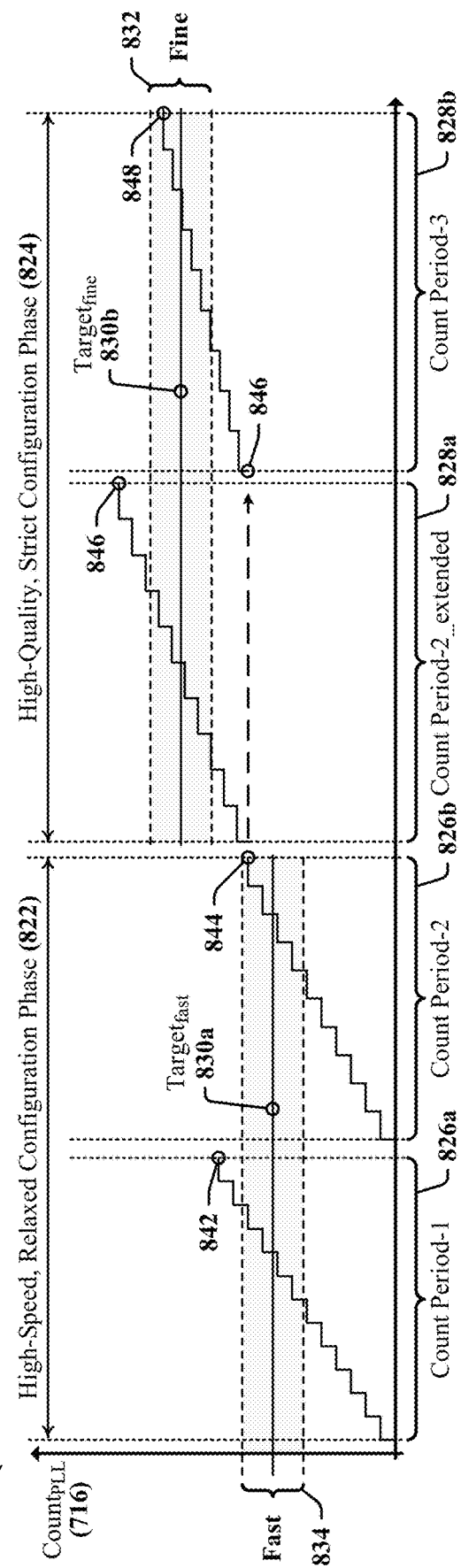
FIG. 8 illustrates certain aspects of a multi-phase calibration process implemented in accordance with aspects of this disclosure.

FIG. 8 illustrates certain aspects of a multi-phase calibration process implemented in accordance with aspects of this disclosure. The multi-phase calibration process may be implemented using some combination of hardware and software and may be controlled by a processor, microcontroller, FSM, sequencing logic, combinational logic or a combination of some of these devices and/or circuits. In one example, the multi-phase calibration process may be implemented using the calibration circuit 700 illustrated in FIG. 7. Reference may be made to the calibration circuit 700 in order to facilitate description of the features, elements, tables and timing illustrated in FIG. 8.

The table 800 provides an example of parameters used to configure the calibration circuit 700 with a combination of parameters defined based on the frequency of the reference clock signal 712 and the PLL output clock signal 714 and the calibration phase. In the illustrated example, the reference clock signal 712 has a frequency 806 of 19.2 MHz and a nominal frequency 808 of 666.67 MHz is defined for the PLL output clock signal 714. Two configurations 802, 804 are defined. A strict configuration 802 can be used in the second phase to obtain a high quality PLL output clock signal 714 with a frequency that lies within the tolerances defined for the interface that includes or is coupled to the PLL 702. A relaxed configuration 804 can be used in the first phase to acquire an early PLL lock and a lower quality PLL output clock signal 714 with a frequency that lies within relaxed tolerances that may be selected to reduce calibration time.

The configurations 802, 804 can be distinguished by the range of acceptable frequencies of the PLL output clock signal 714 that can generate a lock indication. The frequency range may be expressed in parts-per-million variance (PPM 810) from the nominal frequency 808 defined for the PLL output clock signal 714. In the illustrated example, the high quality PLL output clock signal 714 may vary from the nominal frequency 808 by no more than 450 ppm, while the lower quality PLL output clock signal 714 can vary from the nominal frequency 808 by up to 1694 ppm.

The duration of each count period 826a, 826b, 828a, 828b may be defined by number of reference clock cycles 812 to be counted. In the illustrated example, 1024 reference clock cycles 812 may be counted in the strict configuration 802, while 256 reference clock cycles 812 may be counted in the relaxed configuration 804. The target count value 814 for the PLL counter 704 in the strict configuration 802 is set to 35555, while the target count value 814 for the PLL counter 704 in the relaxed configuration 804 is set to 8888. The allowable variance in count value 816 is set at ±16 for both the strict configuration 802 and the relaxed configuration 804. A counter value provided in the $Count_{PLL}$ signal 716 that is within a count of 8 of the corresponding target count value 814 when the reference counter 706 has counted the number of reference clock cycles 812 may trigger a match and/or a lock signal. The table 800 shows tolerance limits 818 expressed as counter values and frequencies for the strict configuration 802 and the relaxed configuration 804.

FIG. 8 further includes a timing diagram 820 that illustrates an example of a two-phase calibration procedure that may be implemented in accordance with certain aspects of this disclosure. The illustrated example may be implemented using the calibration circuit 700 illustrated in FIG. 7. The illustrated calibration procedure represents an example in which the PLL output clock signal 714 has an initial frequency that is greater than the maximum desired frequency. The $Count_{PLL}$ signal 716, which carries the N-bit counter value, is represented on the y-axis and the number of cycles of the reference clock signal 712 counted during the calibration procedure is represented on the x-axis. The timing in the illustrated periods 826a, 826b, 828a, 828b is not shown to scale.

The first phase 822 of the calibration procedure includes an initial low-resolution calibration that can be quickly performed to obtain an early PLL lock for a clock signal using parameters defined for the relaxed configuration 804. In the illustrated example, the first phase 822 of the calibration procedure includes two periods 826a, 826b that have a duration corresponding to the time elapsed while the reference counter 706 counts the number of reference clock cycles 812 defined by the relaxed configuration 804. In the first count period 826a, the N-bit counter value in the $Count_{PLL}$ signal 716 exceeds the upper limit of the limits 834 defined for the target count value 830a in the relaxed configuration 804 at a point in time 842 when the reference counter 706 has counted the reference clock cycles defined by the relaxed configuration 804. The PLL 702 may be reconfigured to reduce the frequency of the PLL output clock signal 714 and a second count period 826b is initiated. In the illustrated example, the N-bit counter value in the $Count_{PLL}$ signal 716 lies between the limits 834 defined for the target count value 830a in the relaxed configuration 804 at a point in time 844 when the reference counter 706 has counted the reference clock cycles defined by the relaxed configuration 804. The C_ready_Early signal 730 may be asserted at the end of the second count period 826b and the calibration procedure enters the second phase 824. The PLL counter 704 may be reset and the reference counter 706 may be configured by the FSM 720 to count the reference clock cycles 812 defined by the relaxed configuration 804 before each of the count periods 826a, 826b commences.

The second phase 824 of the calibration procedure includes a high-resolution calibration that is performed to obtain a PLL lock for a clock signal that is expected to fall within tolerances specified for the PLL output clock signal 714. The second phase 824 of the calibration procedure is configured based on parameters defined for the strict configuration 802. The PLL counter 704 and the reference counter 706 are configured to resume counting without reset. The PLL counter 704 commences counting with the same value that was observed, reported or captured at the point in time 844 when early PLL lock was determined to have been acquired. The reference counter 706 may be configured by the FSM 720 to count a number of reference clock cycles 812 that is calculated as the difference between the target count value 814 defined by the strict configuration 802 and the target count value 814 defined by the relaxed configuration 804. The resumption of counting provides time savings over a procedure that would otherwise repeat the counting cycle in which early PLL lock was acquired.

In the illustrated example, the second phase 824 of the calibration procedure includes two periods 828a, 828b that have a duration corresponding to the time elapsed while the reference counter 706 counts a number of reference clock cycles representing the difference between the reference clock cycles defined for the strict configuration 802 and the reference clock cycles defined for the relaxed configuration 804. In the first count period 828a, the N-bit counter value in the $Count_{PLL}$ signal 716 exceeds the upper limit of the limits 832 defined for the target count value 830b in the strict configuration 802 at a point in time 846 when the reference counter 706 has counted the reference clock cycles 812 defined by the strict configuration 802. The PLL 702 may be reconfigured to reduce the frequency of the PLL output clock signal 714 and a second count period 828b is initiated.

The second count period 828b is initiated when the PLL counter 704 and the reference counter 706 are reconfigured to have the same count values that were observed, reported or captured at the point in time 844 when early PLL lock was determined to have been acquired. In the illustrated example, the N-bit counter value in the $Count_{PLL}$ signal 716 lies between the limits 832 defined for the target count value 830b in the strict configuration 802 at a point in time 848 when the reference counter 706 has counted the reference clock cycles defined by the strict configuration 802. The C_ready signal 732 may be asserted at the end of the second count period 828b and the calibration procedure may be terminated.

A calibration circuit 700 may be configured in accordance with certain aspects of this disclosure to further reduce the time required to acquire PLL lock. The calibration circuit 700 may be used to calibrate a PLL 702 that may be configured using certain control signals 710. In the example illustrated in FIG. 7, the control signals 710 include resistance control signals (Rc), capacitance control signals (Cc) and charge pump control signals (CPc). The resistance control signals and capacitance control signals may be used to configure a low-pass filter that defines the bandwidth of the PLL 702. In normal operation, the bandwidth of the PLL 702 may be defined to meet specifications that limit permissible phase noise. A narrower bandwidth configuration enables the PLL 702 to reject or suppress a greater level of phase noise than is possible for a wider bandwidth configuration. However, the wider bandwidth configuration can allow the PLL output clock signal 714 to converge on its target frequency more quickly than the narrower bandwidth configuration, and can thereby reduce the time required to acquire PLL lock.

In certain implementations, the FSM 720 may configure the control signals 710 to increase the bandwidth of the PLL 702 until C_ready 732 is asserted to indicate that a high-quality PLL lock has been acquired. The bandwidth of the PLL 702 may then be reduced to meet specifications associated with the PLL output clock signal 714 and to reduce or suppress phase noise.

Figure 9:
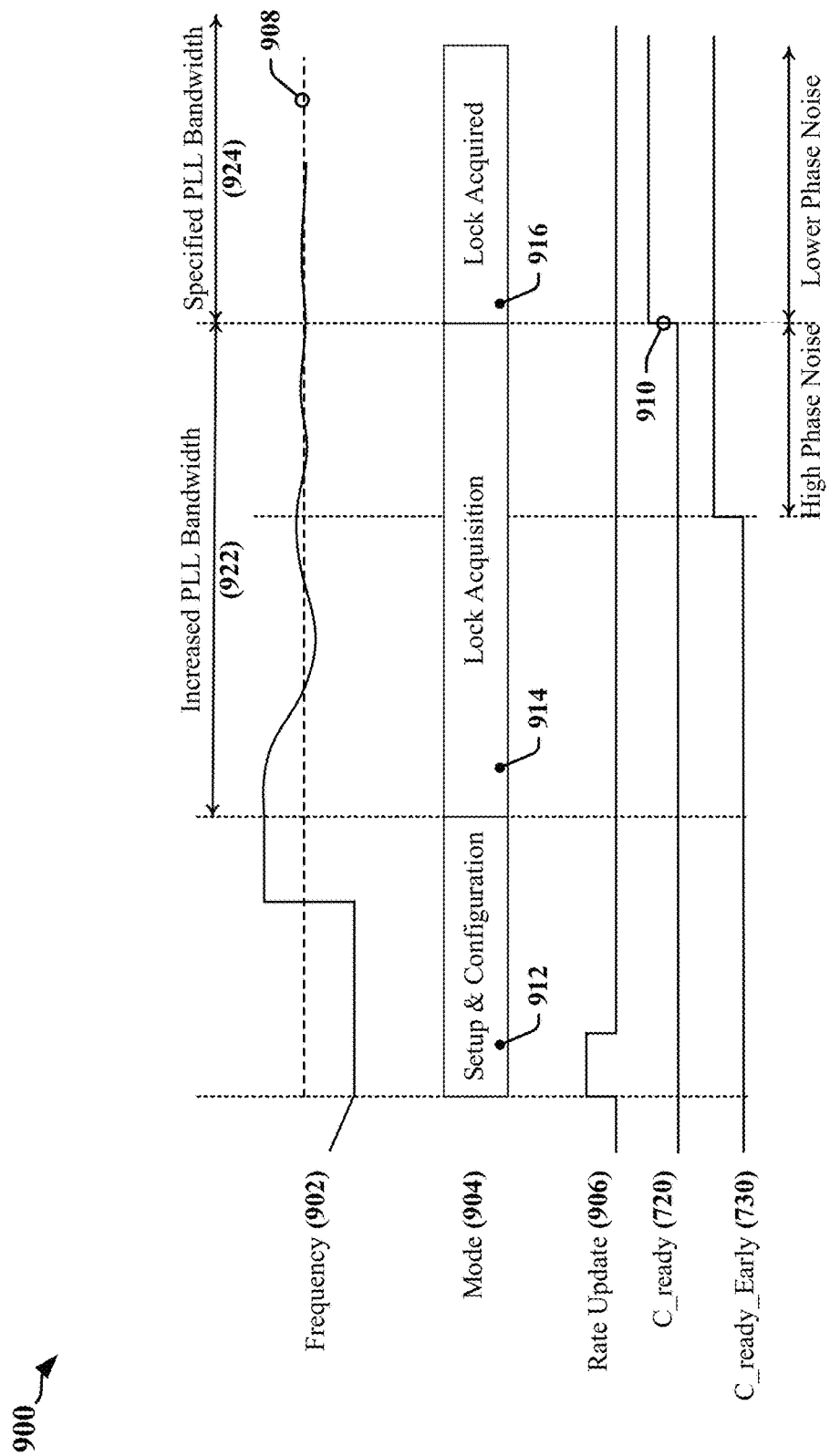
FIG. 9 illustrates a timeline associated with a two-phase calibration procedure illustrated in FIG. 8 when PLL bandwidth is modified to reduce PLL lock acquisition time.

FIG. 9 illustrates a timeline 900 associated with the two-phase calibration procedure illustrated in FIG. 8 when PLL bandwidth is modified to reduce PLL lock acquisition time. The two-phase calibration procedure may be implemented using the calibration circuit 700 illustrated in FIG. 7. The timeline 900 identifies multiple modes 904 associated with the calibration procedure. The PLL 702 generates a PLL output clock signal 714 with a frequency 902 that is initially greater than the maximum desired frequency 908. The setup and configuration mode 912 may be initiated in response to a pulse in the Rate Update signal 906. The pulse may be asserted after a cold start or after the SERDES interface switches gears in a manner that necessitates reconfiguration of the PLL 702. The calibration procedure enters a lock acquisition mode 914. In a first phase 822 of the lock acquisition mode 914, early PLL lock is acquired using relaxed tolerances. In a second phase 824 of the lock acquisition mode 914, a final PLL lock is acquired using strict tolerances. Detection of final PLL lock may cause the C_ready signal 732 to be asserted at a point in time 910 indicating that the PLL output clock signal 714 has a frequency 902 that meets frequency and tolerance specifications defined for the PLL output clock signal 714. The lock acquisition mode 914 is terminated and a lock acquired mode 916 commences, enabling the PLL 702 to be operated normally.

In some implementations, the PLL 702 is configured for increased PLL bandwidth during the initial setup and configuration mode 912 and the PLL 702 operates with increased bandwidth for a period of time 922 that terminates when the C_ready signal 732 is asserted. The PLL 702 is reconfigured to reduce the PLL bandwidth in order to meet specifications associated with the PLL output clock signal 714 during a second period of time 924 when the PLL 702 is operating according to specifications. When operating according to specifications, the bandwidth of the PLL 702 may be configured to limit phase noise (jitter) in the PLL output clock signal 714 in accordance with specifications. Phase noise in the PLL output clock signal 714 in the period of time bounded by assertions of the C_ready_Early signal 730 and the C_ready signal 732 may be increased due to increased bandwidth of the PLL 702.

Figure 10:
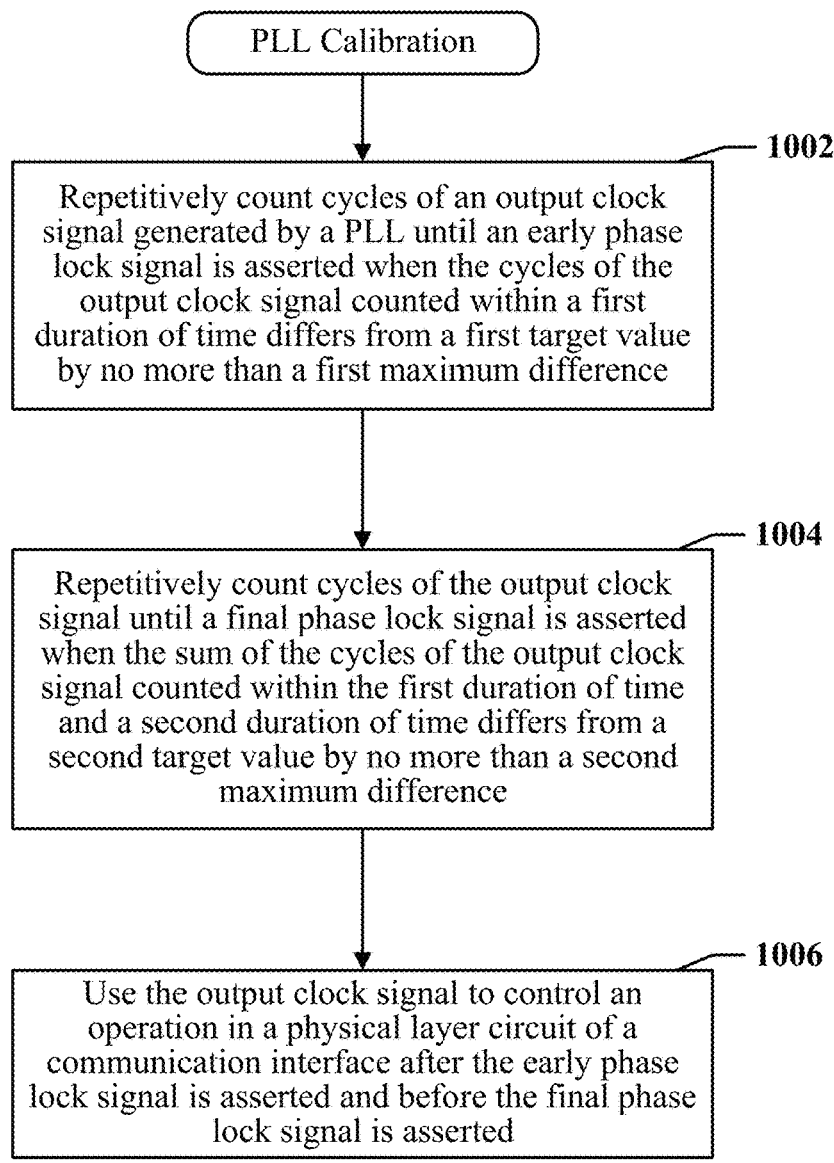
FIG. 10 is a flowchart illustrating an example of a method for calibrating a PLL in accordance with certain aspects of this disclosure.

FIG. 10 is a flowchart illustrating an example of a method 1000 for calibrating a PLL in accordance with certain aspects of this disclosure. The method 1000 may be implemented using a calibration circuit in an IC device that includes a communication link interface. In one example, the transmitting IC device and the receiving IC device are embodied in die on a chip carrier. The method 1000 may relate to certain aspects of this disclosure as described in regard to FIGS. 7-9 and ay be directed to acquiring rapid phase lock for a PLL that includes a charge pump and a low pass filter.

In one example, the method 1000 may be implemented using a calibration circuit that includes a controller or a finite state machine. At block 1002, cycles of an output clock signal generated by the PLL may be repetitively counted until an early phase lock signal is asserted. For each repetition, the cycles of the output clock signal may be counted for a preconfigured first duration of time. The early phase lock signal may be asserted when the cycles of the output clock signal counted within the first duration of time differs from a first target value by no more than a first maximum difference. At block 1004, cycles of the output clock signal may be repetitively counted until a final phase lock signal is asserted. For each repetition, the cycles of the output clock signal may be counted for a preconfigured second duration of time. The final phase lock signal may be asserted when the cycles of the output clock signal counted within the second duration of time differ from a second target value by no more than a second maximum difference. The second duration of time is typically greater than the first duration of time. In some instances, the first duration of time is included in the second duration of time. At block 1006, the output clock signal may be used to control an operation in a physical layer (PHY) circuit of a communication interface after the early phase lock signal is asserted and before the final phase lock signal is asserted. The operation in the PHY circuit may relate to initialization, configuration exit from a cold reset. In one example, the output clock signal may clock one or more buffers while the buffers are being flushed or initialized. In another example, the output clock signal may be provided to driver circuits while the driver circuits are calibrated for voltage and/or switching speed.

In certain implementations, a reference counter may be configured to count a first number of cycles of a reference clock signal before the early phase lock signal is asserted. The duration of the first number of cycles of the reference clock signal typically corresponds to the first duration of time. The reference counter may be further configured to count a second number of cycles of the reference clock signal after the early phase lock signal is asserted. The duration of the second number of cycles of the reference clock signal typically corresponds to the first duration of time. In some instances, the reference counter may be configured to continue counting from a value corresponding to the first number after the early phase lock signal is asserted. The second number may be greater than the first number.

In certain implementations, a PLL counter may be configured to count cycles of the output clock signal generated by the PLL. A comparator may be configured to compare an output of the PLL counter to the first target value before the early phase lock signal is asserted. The comparator may be configured to compare an output of the PLL counter to the second target value after the early phase lock signal is asserted. The PLL counter may be configured to continue counting from a value corresponding to its output captured when the early phase lock signal is asserted.

In some implementations, the first maximum difference has the same value as the second maximum difference.

In certain implementations, the PLL may adjust frequency of the output clock signal when the cycles of the output clock signal counted within the first duration of time differs from the first target value by more than the first maximum difference before the early phase lock signal is asserted. The PLL may adjust frequency of the output clock signal when the cycles of the output clock signal counted within the second duration of time differ from the first target value by more than the second maximum difference after the early phase lock signal is asserted. The PLL may adjust the frequency of the output clock signal when a control input provided to a charge pump within the PLL is reconfigured.

In some implementations, a first bandwidth may be configured for the PLL before the early phase lock signal is asserted. A second bandwidth may be configured for the PLL after the final phase lock signal is asserted. The first bandwidth is typically greater than the second bandwidth. Configuring the bandwidth of the PLL may include modifying a resistance value or a capacitance value in the low pass filter of the PLL.

In one example, the method 1000 may be implemented using a calibration circuit that includes a controller or a finite state machine. The calibration circuit may further include a first counter configured to count cycles of the output clock signal generated by the PLL, a second counter configured to count cycles of the reference clock signal, a comparator configured to assert a match signal when a multibit output of the first counter differs from a target value input by no more than a maximum difference, and a controller. In one example, the controller is implemented using an FSM. The controller may be configured or adapted to configure the target value input of the comparator with a first target value, configure the second counter to count a first number of cycles of the reference clock signal, assert an early phase lock signal when the cycles of the output clock signal counted by the first counter differs from the first target value by no more than a first maximum difference after the second counter has counted the first number of cycles. The controller may be further configured or adapted to configure the target value input of the comparator with a second target value, configure the second counter to count a second number of cycles of the reference clock signal, and assert a final phase lock signal when the cycles of the output clock signal counted by the first counter differs from the second target value by no more than a second maximum difference after the second counter has counted the second number of cycles. The output clock signal may be used to control an operation in a PHY circuit of a communication interface after the early phase lock signal is asserted and before the final phase lock signal is asserted.

In some implementations, the first number of cycles of the reference clock signal corresponds to a first duration of time, and the second number of cycles of the reference clock signal corresponds to a second duration of time that is greater than the first duration of time. In some instances, the first duration of time is included in the second duration of time. The controller may be further configured or adapted to configure the second counter to continue counting from a value corresponding to the first number after the early phase lock signal is asserted.

In certain implementations, the controller is further configured or adapted to configure the first counter to continue counting from a value corresponding to its output captured when the early phase lock signal is asserted.

In some instances, the first maximum difference has the same value as the second maximum difference.

In some implementations, the controller is further configured or adapted to cause the PLL to adjust frequency of the output clock signal when the cycles of the output clock signal counted within the first duration of time differs from the first target value by more than the first maximum difference before the early phase lock signal is asserted, and cause the PLL to adjust frequency of the output clock signal when the cycles of the output clock signal counted within the second duration of time differ from the first target value by more than the second maximum difference after the early phase lock signal is asserted. The controller is further configured or adapted to reconfigure a control input provided to a charge pump within the PLL to cause the PLL to adjust the frequency of the output clock signal.

In certain implementations, the controller is further configured or adapted to configure a first bandwidth of the PLL before the early phase lock signal is asserted, and configure a second bandwidth of the PLL after the final phase lock signal is asserted. The first bandwidth is typically greater than the second bandwidth. In some examples, bandwidth of the PLL may be configured by modifying a resistance value or a capacitance value in a low pass filter within the PLL.

Certain implementations relate to a storage medium that may be non-transitory in nature. Storage media may include memory devices and mass storage devices, and may be referred to herein as computer-readable media and/or processor-readable media. The storage media may be used for storing data that is manipulated by a processor, controller, FSM or sequencer when executing software, and the software may be configured to implement any one of the methods disclosed herein. The software may reside in computer-readable form in the storage media. In accordance with certain aspects of this disclosure, a processor-readable storage medium stores code and data thereon. The code may be executed by a processor, controller, state machine, or sequencer. The code, when executed by the processor, causes a calibration circuit to repetitively count cycles of an output clock signal generated by a PLL until an early phase lock signal is asserted when the cycles of the output clock signal counted within a first duration of time differ from a first target value by no more than a first maximum difference, repetitively count cycles of the output clock signal until a final phase lock signal is asserted when the cycles of the output clock signal counted within a second duration of time differ from a second target value by no more than a second maximum difference, the second duration of time being greater than the first duration of time, and use the output clock signal to control an operation in a physical layer circuit of a communication interface after the early phase lock signal is asserted and before the final phase lock signal is asserted. In some instances, the first duration of time is included in the second duration of time.

In some implementations, the code further causes the calibration circuit to configure a reference counter to count a first number of cycles of a reference clock signal before the early phase lock signal is asserted, and configure the reference counter to count a second number of cycles of the reference clock signal after the early phase lock signal is asserted. The duration of the first number of cycles of the reference clock signal may correspond to the first duration of time. The duration of the second number of cycles of the reference clock signal may correspond to the second duration of time. The code may further cause the calibration circuit to configure the reference counter to continue counting from a value corresponding to the first number after the early phase lock signal is asserted. The second number is typically greater than the first number.

In certain implementations, the code further causes the calibration circuit to configure a PLL counter to count cycles of the output clock signal generated by the PLL, configure a comparator to compare an output of the PLL counter to the first target value before the early phase lock signal is asserted, and configure the comparator to compare an output of the PLL counter to the second target value after the early phase lock signal is asserted. The code may further cause the calibration circuit to configure the PLL counter to continue counting from a value corresponding to its output captured when the early phase lock signal is asserted.

In one example, the first maximum difference has the same value as the second maximum difference.

In some implementations, the code further causes the calibration circuit to cause the PLL to adjust frequency of the output clock signal when the cycles of the output clock signal counted within the first duration of time differs from the first target value by more than the first maximum difference before the early phase lock signal is asserted, and cause the PLL to adjust frequency of the output clock signal when the cycles of the output clock signal counted within the second duration of time differ from the first target value by more than the second maximum difference after the early phase lock signal is asserted. The code may further cause the calibration circuit to reconfigure a control input provided to a charge pump within the PLL to adjust the frequency of the output clock signal.

In certain implementations, the code further causes the calibration circuit to configure a first bandwidth of the PLL before the early phase lock signal is asserted, and configure a second bandwidth of the PLL after the final phase lock signal is asserted. The first bandwidth is greater than the second bandwidth in many implementations. In some examples, bandwidth of the PLL may be configured by modifying a resistance value or a capacitance value in a low pass filter within the PLL.

Some implementation examples are described in the following numbered clauses:

1. A method for calibrating a phase locked loop (PLL), comprising: repetitively counting cycles of an output clock signal generated by the PLL until an early phase lock signal is asserted when the cycles of the output clock signal counted within a first duration of time differ from a first target value by no more than a first maximum difference; repetitively counting cycles of the output clock signal until a final phase lock signal is asserted when the cycles of the output clock signal counted within a second duration of time differ from a second target value by no more than a second maximum difference, the second duration of time being greater than the first duration of time; and using the output clock signal to control an operation in a physical layer circuit of a communication interface after the early phase lock signal is asserted and before the final phase lock signal is asserted.
2. The method as described in clause 1, further comprising: configuring a reference counter to count a first number of cycles of a reference clock signal before the early phase lock signal is asserted, the duration of the first number of cycles of the reference clock signal corresponding to the first duration of time; and configuring the reference counter to count a second number of cycles of the reference clock signal after the early phase lock signal is asserted, the duration of the second number of cycles of the reference clock signal corresponding to the first duration of time.
3. The method as described in clause 2, further comprising: configuring the reference counter to continue counting from a value corresponding to the first number after the early phase lock signal is asserted, wherein the second number is greater than the first number.
4. The method as described in any of clauses 1-3, further comprising: configuring a PLL counter to count cycles of the output clock signal generated by the PLL; configuring a comparator to compare an output of the PLL counter to the first target value before the early phase lock signal is asserted; and configuring the comparator to compare an output of the PLL counter to the second target value after the early phase lock signal is asserted.
5. The method as described in clause 4, further comprising: configuring the PLL counter to continue counting from a value corresponding to its output captured when the early phase lock signal is asserted.
6. The method as described in any of clauses 1-5, wherein the first maximum difference has the same value as the second maximum difference.
7. The method as described in any of clauses 1-6, further comprising: causing the PLL to adjust frequency of the output clock signal when the cycles of the output clock signal counted within the first duration of time differs from the first target value by more than the first maximum difference before the early phase lock signal is asserted; and causing the PLL to adjust frequency of the output clock signal when the cycles of the output clock signal counted within the second duration of time differ from the first target value by more than the second maximum difference after the early phase lock signal is asserted.
8. The method as described in clause 7, wherein causing the PLL to adjust the frequency of the output clock signal comprises: reconfiguring a control input provided to a charge pump within the PLL.
9. The method as described in any of clauses 1-8, further comprising: configuring a first bandwidth of the PLL before the early phase lock signal is asserted; and configuring a second bandwidth of the PLL after the final phase lock signal is asserted, wherein the first bandwidth is greater than the second bandwidth, wherein bandwidth of the PLL is configured by modifying a resistance value or a capacitance value in a low pass filter within the PLL.
10. The method as described in any of clauses 1-9, wherein the second duration of time includes the first duration of time.
11. A processor-readable storage medium storing code thereon, the code when executed by a processor causes a calibration circuit to: repetitively count cycles of an output clock signal generated by a phase locked loop (PLL) until an early phase lock signal is asserted when the cycles of the output clock signal counted within a first duration of time differ from a first target value by no more than a first maximum difference; repetitively count cycles of the output clock signal until a final phase lock signal is asserted when the cycles of the output clock signal counted within a second duration of time differ from a second target value by no more than a second maximum difference, the second duration of time being greater than the first duration of time; and use the output clock signal to control an operation in a physical layer circuit of a communication interface after the early phase lock signal is asserted and before the final phase lock signal is asserted.
12. The processor-readable storage medium as described in clause 11, wherein the code further causes the calibration circuit to: configure a reference counter to count a first number of cycles of a reference clock signal before the early phase lock signal is asserted, the duration of the first number of cycles of the reference clock signal corresponding to the first duration of time; and configure the reference counter to count a second number of cycles of the reference clock signal after the early phase lock signal is asserted, the duration of the second number of cycles of the reference clock signal corresponding to the second duration of time.
13. The processor-readable storage medium as described in clause 12, wherein the code further causes the calibration circuit to: configure the reference counter to continue counting from a value corresponding to the first number after the early phase lock signal is asserted, wherein the second number is greater than the first number.
14. The processor-readable storage medium as described in any of clauses 11-13, wherein the code further causes the calibration circuit to: configure a PLL counter to count cycles of the output clock signal generated by the PLL; configure a comparator to compare an output of the PLL counter to the first target value before the early phase lock signal is asserted; and configure the comparator to compare an output of the PLL counter to the second target value after the early phase lock signal is asserted.

15. The processor-readable storage medium as described in clause 14, wherein the code further causes the calibration circuit to: configure the PLL counter to continue counting from a value corresponding to its output captured when the early phase lock signal is asserted.

16. The processor-readable storage medium as described in any of clauses 11-15, wherein the first maximum difference has the same value as the second maximum difference.

17. The processor-readable storage medium as described in any of clauses 11-16, wherein the code further causes the calibration circuit to: cause the PLL to adjust frequency of the output clock signal when the cycles of the output clock signal counted within the first duration of time differs from the first target value by more than the first maximum difference before the early phase lock signal is asserted; and cause the PLL to adjust frequency of the output clock signal when the cycles of the output clock signal counted within the second duration of time differ from the first target value by more than the second maximum difference after the early phase lock signal is asserted.

18. The processor-readable storage medium as described in clause 17, wherein the code further causes the calibration circuit to: reconfigure a control input provided to a charge pump within the PLL to adjust the frequency of the output clock signal.

19. The processor-readable storage medium as described in any of clauses 11-18, wherein the code further causes the calibration circuit to: configure a first bandwidth of the PLL before the early phase lock signal is asserted; and configure a second bandwidth of the PLL after the final phase lock signal is asserted, wherein the first bandwidth is greater than the second bandwidth, wherein bandwidth of the PLL is configured by modifying a resistance value or a capacitance value in a low pass filter within the PLL.

20. The processor-readable storage medium as described in any of clauses 11-19, wherein the second duration of time includes the first duration of time.

21. A calibration circuit, comprising: a first counter configured to count cycles of an output clock signal generated by a phase-locked loop (PLL); a second counter configured to count cycles of a reference clock signal; a comparator configured to assert a match signal when a multibit output of the first counter differs from a target value input by no more than a maximum difference; and a controller configured to: configure the target value input of the comparator with a first target value; configure the second counter to count a first number of cycles of the reference clock signal; assert an early phase lock signal when the cycles of the output clock signal counted by the first counter differs from the first target value by no more than a first maximum difference after the second counter has counted the first number of cycles; configure the target value input of the comparator with a second target value; configure the second counter to count a second number of cycles of the reference clock signal; and assert a final phase lock signal when the cycles of the output clock signal counted by the first counter differs from the second target value by no more than a second maximum difference after the second counter has counted the second number of cycles, wherein the output clock signal is used to control an operation in a physical layer circuit of a communication interface after the early phase lock signal is asserted and before the final phase lock signal is asserted.

22. The calibration circuit as described in clause 21, wherein the first number of cycles of the reference clock signal corresponds to a first duration of time, and wherein the second number of cycles of the reference clock signal corresponds to a second duration of time that is greater than the first duration of time.

23. The calibration circuit as described in clause 22, wherein the controller is further configured to: configure the second counter to continue counting from a value corresponding to the first number after the early phase lock signal is asserted.

24. The calibration circuit as described in any of clauses 21-23, wherein the controller is further configured to: configure the first counter to continue counting from a value corresponding to its output captured when the early phase lock signal is asserted.

25. The calibration circuit as described in any of clauses 21-24, wherein the first maximum difference has the same value as the second maximum difference.

26. The calibration circuit as described in any of clauses 21-25, wherein the controller is further configured to: cause the PLL to adjust frequency of the output clock signal when the cycles of the output clock signal counted within the first duration of time differs from the first target value by more than the first maximum difference before the early phase lock signal is asserted; and cause the PLL to adjust frequency of the output clock signal when the cycles of the output clock signal counted within the second duration of time differ from the first target value by more than the second maximum difference after the early phase lock signal is asserted.

27. The calibration circuit as described in clause 26, wherein the controller is further configured to: reconfigure a control input provided to a charge pump within the PLL to cause the PLL to adjust the frequency of the output clock signal.

28. The calibration circuit as described in any of clauses 21-27, wherein the controller is further configured to: configure a first bandwidth of the PLL before the early phase lock signal is asserted; and configure a second bandwidth of the PLL after the final phase lock signal is asserted, wherein the first bandwidth is greater than the second bandwidth, wherein bandwidth of the PLL is configured by modifying a resistance value or a capacitance value in a low pass filter within the PLL.

29. The calibration circuit as described in any of clauses 21-28, wherein the second duration of time includes the first duration of time.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A calibration circuit, comprising:
a first counter configured to count cycles of an output clock signal generated by a phase-locked loop (PLL);
a second counter configured to count cycles of a reference clock signal;
a comparator configured to assert a match signal when a multibit output of the first counter differs from a target value input by no more than a maximum difference; and
a controller configured to:
configure the target value input of the comparator with a first target value;
configure the second counter to count a first number of cycles of the reference clock signal;
assert an early phase lock signal when the cycles of the output clock signal counted by the first counter differs from the first target value by no more than a first maximum difference after the second counter has counted the first number of cycles;
configure the target value input of the comparator with a second target value;
configure the second counter to count a second number of cycles of the reference clock signal; and
assert a final phase lock signal when the cycles of the output clock signal counted by the first counter differs from the second target value by no more than a second maximum difference after the second counter has counted the second number of cycles,
wherein the output clock signal is used to control an operation in a physical layer circuit of a communication interface after the early phase lock signal is asserted and before the final phase lock signal is asserted.

2. The calibration circuit of claim 1, wherein the controller is further configured to:
configure the second counter to continue counting from a value corresponding to the first number after the early phase lock signal is asserted.

3. The calibration circuit of claim 1, wherein the controller is further configured to:
configure the first counter to continue counting from a value corresponding to its output captured when the early phase lock signal is asserted.

4. The calibration circuit of claim 1, wherein the first maximum difference has the same value as the second maximum difference.

5. The calibration circuit of claim 1, wherein the first number of cycles of the reference clock signal corresponds to a first duration of time, and wherein the second number of cycles of the reference clock signal corresponds to a second duration of time that is greater than the first duration of time.

6. The calibration circuit of claim 5, wherein the controller is further configured to:
cause the PLL to adjust frequency of the output clock signal when the cycles of the output clock signal counted within the first duration of time differs from the first target value by more than the first maximum difference before the early phase lock signal is asserted; and
cause the PLL to adjust frequency of the output clock signal when the cycles of the output clock signal counted within the second duration of time differ from the first target value by more than the second maximum difference after the early phase lock signal is asserted.

7. The calibration circuit of claim 1, wherein the controller is further configured to:
configure a first bandwidth of the PLL before the early phase lock signal is asserted; and
configure a second bandwidth of the PLL after the final phase lock signal is asserted, wherein the first bandwidth is greater than the second bandwidth,
wherein bandwidth of the PLL is configured by modifying a resistance value or a capacitance value in a low pass filter within the PLL.

8. A method for calibrating a phase locked loop (PLL), comprising:
repetitively counting cycles of an output clock signal generated by the PLL until an early phase lock signal is asserted when the cycles of the output clock signal counted within a first duration of time differ from a first target value by no more than a first maximum difference;
repetitively counting cycles of the output clock signal until a final phase lock signal is asserted when the cycles of the output clock signal counted within a second duration of time differ from a second target value by no more than a second maximum difference, the second duration of time being greater than the first duration of time; and
using the output clock signal to control an operation in a physical layer circuit of a communication interface after the early phase lock signal is asserted and before the final phase lock signal is asserted.

9. The method of claim 8, further comprising:
configuring a reference counter to count a first number of cycles of a reference clock signal before the early phase lock signal is asserted, the duration of the first number of cycles of the reference clock signal corresponding to the first duration of time; and
configuring the reference counter to count a second number of cycles of the reference clock signal after the early phase lock signal is asserted, the duration of the second number of cycles of the reference clock signal corresponding to the first duration of time.

10. The method of claim 9, further comprising:
configuring the reference counter to continue counting from a value corresponding to the first number after the early phase lock signal is asserted, wherein the second number is greater than the first number.

11. The method of claim 8, further comprising:
configuring a PLL counter to count cycles of the output clock signal generated by the PLL;
configuring a comparator to compare an output of the PLL counter to the first target value before the early phase lock signal is asserted; and
configuring the comparator to compare an output of the PLL counter to the second target value after the early phase lock signal is asserted.

12. The method of claim 11, further comprising:
configuring the PLL counter to continue counting from a value corresponding to its output captured when the early phase lock signal is asserted.

13. The method of claim 8, further comprising:
causing the PLL to adjust frequency of the output clock signal when the cycles of the output clock signal counted within the first duration of time differs from the first target value by more than the first maximum difference before the early phase lock signal is asserted; and
causing the PLL to adjust frequency of the output clock signal when the cycles of the output clock signal counted within the second duration of time differ from the first target value by more than the second maximum difference after the early phase lock signal is asserted.

14. The method of claim 13, wherein causing the PLL to adjust the frequency of the output clock signal comprises:
reconfiguring a control input provided to a charge pump within the PLL.

15. The method of claim 8, further comprising:
configuring a first bandwidth of the PLL before the early phase lock signal is asserted; and
configuring a second bandwidth of the PLL after the final phase lock signal is asserted, wherein the first bandwidth is greater than the second bandwidth,
wherein bandwidth of the PLL is configured by modifying a resistance value or a capacitance value in a low pass filter within the PLL.

16. A processor-readable storage medium storing code thereon, the code when executed by a processor causes a calibration circuit to:
repetitively count cycles of an output clock signal generated by a phase locked loop (PLL) until an early phase lock signal is asserted when the cycles of the output clock signal counted within a first duration of time differ from a first target value by no more than a first maximum difference;
repetitively count cycles of the output clock signal until a final phase lock signal is asserted when the cycles of the output clock signal counted within a second duration of time differ from a second target value by no more than a second maximum difference, the second duration of time being greater than the first duration of time; and
use the output clock signal to control an operation in a physical layer circuit of a communication interface after the early phase lock signal is asserted and before the final phase lock signal is asserted.

17. The processor-readable storage medium of claim 16, wherein the code further causes the calibration circuit to:
configure a reference counter to count a first number of cycles of a reference clock signal before the early phase lock signal is asserted, the duration of the first number of cycles of the reference clock signal corresponding to the first duration of time; and
configure the reference counter to count a second number of cycles of the reference clock signal after the early phase lock signal is asserted, the duration of the second number of cycles of the reference clock signal corresponding to the second duration of time.

18. The processor-readable storage medium of claim 17, wherein the code further causes the calibration circuit to:
configure the reference counter to continue counting from a value corresponding to the first number after the early phase lock signal is asserted, wherein the second number is greater than the first number.

19. The processor-readable storage medium of claim 16, wherein the code further causes the calibration circuit to:
configure a PLL counter to count cycles of the output clock signal generated by the PLL;
configure a comparator to compare an output of the PLL counter to the first target value before the early phase lock signal is asserted;
configure the comparator to compare an output of the PLL counter to the second target value after the early phase lock signal is asserted; and
configure the PLL counter to continue counting from a value corresponding to its output captured when the early phase lock signal is asserted.

20. The processor-readable storage medium of claim 16, wherein the code further causes the calibration circuit to:
configure a first bandwidth of the PLL before the early phase lock signal is asserted; and
configure a second bandwidth of the PLL after the final phase lock signal is asserted, wherein the first bandwidth is greater than the second bandwidth,
wherein bandwidth of the PLL is configured by modifying a resistance value or a capacitance value in a low pass filter within the PLL.

* * * * *